United States Patent
Nappen et al.

(10) Patent No.: US 8,350,584 B2
(45) Date of Patent: Jan. 8, 2013

(54) TEST HEAD POSITIONING SYSTEM AND METHOD

(75) Inventors: Charles P. Nappen, Woodbury, NJ (US); Christopher L. West, Medford, NJ (US); Steven J. Crowell, Merchantville, NJ (US)

(73) Assignee: inTEST Corporation, Mt. Laurel, NJ (US)

( * ) Notice: Subject to any disclaimer, the term of this patent is extended or adjusted under 35 U.S.C. 154(b) by 155 days.

(21) Appl. No.: 12/521,470

(22) PCT Filed: Dec. 26, 2007

(86) PCT No.: PCT/US2007/026307
§ 371 (c)(1),
(2), (4) Date: Jun. 26, 2009

(87) PCT Pub. No.: WO2008/085463
PCT Pub. Date: Jul. 17, 2008

(65) Prior Publication Data
US 2010/0045323 A1  Feb. 25, 2010

Related U.S. Application Data

(60) Provisional application No. 60/971,104, filed on Sep. 10, 2007, provisional application No. 60/971,123, filed on Sep. 10, 2007, provisional application No. 60/877,915, filed on Dec. 29, 2006.

(51) Int. Cl.
*G01R 31/20* (2006.01)
*G01R 31/00* (2006.01)

(52) U.S. Cl. .......... 324/754.15; 324/756.02; 324/756.07

(58) Field of Classification Search ............. 324/754.09, 324/754.15, 756.02, 756.07
See application file for complete search history.

(56) References Cited

U.S. PATENT DOCUMENTS

| | | | |
|---|---|---|---|
| 3,887,155 A | 6/1975 | Bertalot | |
| 4,589,815 A | 5/1986 | Smith | |
| 4,705,447 A | 11/1987 | Smith | |
| 4,715,574 A | 12/1987 | Holt et al. | |
| 4,893,074 A | 1/1990 | Holt et al. | |
| 5,030,869 A | 7/1991 | Holt et al. | |
| 5,410,259 A * | 4/1995 | Fujihara et al. | 324/750.23 |
| 5,450,766 A | 9/1995 | Holt | |
| 5,568,056 A * | 10/1996 | Ishimoto | 324/754.07 |
| 5,600,258 A | 2/1997 | Graham et al. | |

(Continued)

FOREIGN PATENT DOCUMENTS

DE  203 11 524  11/2004

(Continued)

OTHER PUBLICATIONS

Supplemental European Search Report for EP 07868019 dated Oct. 8, 2010.

(Continued)

*Primary Examiner* — Joshua Benitez Rosario
(74) *Attorney, Agent, or Firm* — RatnerPrestia

(57) ABSTRACT

An apparatus for supporting a device, comprising a base assembly, a plurality of carrier columns extending from the base unit, and a plurality of vertical support plates, each vertically movable along a respective carrier column and including a pivotal device mounting bracket. A pneumatic unit including a piston rod is associated with each vertical support plate such that vertical motion of the piston rod controls vertical motion of the respective vertical support plate.

37 Claims, 27 Drawing Sheets

U.S. PATENT DOCUMENTS

| | | | |
|---|---|---|---|
| 5,608,334 | A | 3/1997 | Holt |
| 5,900,737 | A | 5/1999 | Graham et al. |
| 5,931,048 | A | 8/1999 | Slocum et al. |
| 5,949,002 | A | 9/1999 | Alden |
| 6,049,214 | A * | 4/2000 | Nishikawa et al. ...... 324/750.25 |
| 6,057,695 | A | 5/2000 | Holt et al. |
| 6,433,532 | B1 * | 8/2002 | Boon et al. ............... 324/750.25 |
| 6,586,925 | B2 * | 7/2003 | Ramesh et al. .......... 324/750.19 |
| 6,838,868 | B1 * | 1/2005 | Bosy ....................... 324/750.22 |
| 6,846,211 | B2 * | 1/2005 | Yasuda et al. .................... 440/77 |
| 7,068,056 | B1 * | 6/2006 | Gibbs et al. .............. 324/750.16 |
| 7,084,358 | B2 | 8/2006 | Ny et al. |
| 7,235,964 | B2 | 6/2007 | Mueller |
| 7,688,096 | B2 * | 3/2010 | Inomata ................... 324/750.24 |
| 7,764,076 | B2 * | 7/2010 | Di Stefano et al. ...... 324/756.01 |
| 8,035,406 | B2 * | 10/2011 | Mueller ................... 324/750.25 |
| 8,212,578 | B1 * | 7/2012 | Gajda et al. .............. 324/750.16 |
| 2003/0230155 | A1 | 12/2003 | Caradonna et al. |
| 2004/0051517 | A1 | 3/2004 | Holt et al. |
| 2004/0227534 | A1 * | 11/2004 | Mueller ........................ 324/758 |
| 2005/0040812 | A1 | 2/2005 | Holt et al. |
| 2005/0116729 | A1 * | 6/2005 | Koester et al. ................ 324/754 |
| 2006/0001416 | A1 | 1/2006 | West |
| 2006/0177298 | A1 | 8/2006 | Mueller |

FOREIGN PATENT DOCUMENTS

| | | |
|---|---|---|
| EP | 1 249 189 | 10/2002 |
| EP | 1277692 A1 | 1/2003 |
| WO | WO 01/64389 | 9/2001 |
| WO | WO 2004031782 | 4/2004 |
| WO | WO 2004/090558 A2 | 10/2004 |
| WO | WO 2005015245 | 2/2005 |

OTHER PUBLICATIONS

European Search Report issued in related European Application No. 12172869.5, mailed Aug. 31, 2012.

Partial European Search Report issued in related European Application No. 12176276.9, mailed Oct. 25, 2012.

* cited by examiner

TEST HEAD POSITIONING SYSTEM AND METHOD

FIELD OF THE INVENTION

The present invention relates to systems for positioning and manipulating loads, and more particularly, to systems for positioning and manipulating test heads.

BACKGROUND OF THE INVENTION

In the manufacture of integrated circuits (ICs) and other electronic devices, testing with automatic test equipment (ATE) is performed at one or more stages of the overall process. Special handling apparatus is used which places the device to be tested into position for testing. In some cases, the special handling apparatus may also bring the device to be tested to the proper temperature and/or maintain it at the proper temperature as it is being tested. The special handling apparatus is of various types including "probers" for testing unpackaged devices on a wafer and "device handlers" or "package handlers" for testing packaged parts; herein, "handling apparatus," "test peripheral," or simply "peripheral" will be used to refer to all types of such peripheral apparatus. The electronic testing itself is provided by a large and expensive ATE system which includes a test head which is required to connect to and dock with the handling apparatus. The Device Under Test ("DUT" or "dut") requires precision, high-speed signals for effective testing; accordingly, the "test electronics" within the ATE, which are used to test the DUT, are typically located in the test head, which must be positioned as close as possible to the DUT. The test head is extremely heavy, and as DUTs become increasingly complex with increasing numbers of electrical connections, the size and weight of test heads have grown from a few hundred pounds to presently as much as two or three thousand pounds. The test head is typically connected to the ATE's stationary mainframe by means of a cable, which provides conductive paths for signals, grounds, and electrical power. In addition, the test head may require coolant to be supplied to it by way of flexible tubing, which is often bundled within the cable.

In testing complex devices, hundreds or thousands of electrical connections have to be established between the test head and the DUT. These connections are accomplished with delicate, densely spaced contacts. In testing unpackaged devices on a wafer, the actual connection to the DUT is typically achieved with needle-like probes mounted on a probe card. In testing packaged devices, it is typical to use a test socket mounted on a "DUT board." In either case, the probe card or DUT board is usually fixed appropriately to the handling apparatus, which brings each of a number of DUTs in turn into position for testing. In either case the probe card or DUT board also provides connection points with which the test head can make corresponding electrical connections. The test head is typically equipped with an interface unit that includes contact elements to achieve the connections with the probe card or DUT board. Typically, the contact elements are spring loaded "pogo pins." Overall, the contacts are very fragile and delicate, and they must be protected from damage.

Test head manipulators may be used to maneuver the test head with respect to the handling apparatus. Such maneuvering may be over relatively substantial distances on the order of one meter or more. The goal is to be able to quickly change from one handling apparatus to another or to move the test head away from the present handling apparatus for service and/or for changing interface components. When the test head is held in a position with respect to the handling apparatus such that all of the connections between the test head and probe card or DUT board have been achieved, the test head is said to be "docked" to the handling apparatus. In order for successful docking to occur, the test head must be precisely positioned in six degrees of freedom with respect to a Cartesian coordinate system. Most often, a test head manipulator is used to maneuver the test head into a first position of coarse alignment within approximately a few centimeters of the docked position, and a "docking apparatus" is then used to achieve the final precise positioning. Typically, a portion of the docking apparatus is disposed on the test head and the rest of it is disposed on the handling apparatus. Because one test head may serve a number of handling apparatuses, it is usually preferred to put the more expensive portions of the docking apparatus on the test head. The docking apparatus may include an actuator mechanism which draws the two segments of the dock together, thus docking the test head; this is referred to as "actuator driven" docking. The docking apparatus, or "dock" has numerous important functions, including: (1) alignment of the test head with the handling apparatus, (2) pulling together, and later separating, the test head and the handling apparatus, (3) providing pre-alignment protection for electrical contacts, and (4) latching or holding the test head and the handling apparatus together.

According to the in TEST Handbook ($5^{th}$ Edition© 1996, in TEST Corporation), "Test head positioning" refers to the easy movement of a test head to a handling apparatus combined with the precise alignment to the handling apparatus required for successful docking and undocking. A test head manipulator may also be referred to as a test head positioner. A test head manipulator combined with an appropriate docking means performs test head positioning. This technology is described, for example, in the aforementioned in TEST Handbook. This technology is also described, for example, in U.S. Pat. Nos. 5,608,334, 5,450,766, 5,030,869, 4,893,074, 4,715,574, and 4,589,815, which are all incorporated by reference for their teachings in the field of test head positioning systems. The foregoing patents relate primarily to actuator driven docking. Test head positioning systems are also known where a single apparatus provides both relatively large distance maneuvering of the test head and final precise docking. For example, U.S. Pat. No. 6,057,695, Holt et al., and U.S. Pat. Nos. 5,900,737 and 5,600,258, Graham et al., which are all incorporated by reference, describe a positioning system where docking is "manipulator driven" rather than actuator driven. However, actuator driven systems are the most widely used, and the present invention is directed towards them.

In the typical actuator driven positioning system, an operator controls the movement of the manipulator to maneuver the test head from one location to another. This may be accomplished manually by the operator exerting force directly on the test head in systems where the test head is fully balanced in its motion axes, or it may be accomplished through the use of actuators directly controlled by the operator. In several contemporary systems, the test head is maneuvered by a combination of direct manual force in some axes and by actuators in other axes.

In order to dock the test head with the handling apparatus, the operator must first maneuver the test head to a "ready to dock" position, which is close to and in approximate alignment with its final docked position. The test head is further maneuvered until it is in a "ready to actuate" position where the docking actuator can take over control of the test head's motion. The actuator can then draw the test head into its final, fully docked position. In doing so, various alignment features provide final alignment of the test head. A dock may use two or more sets of alignment features of different types to provide different stages of alignment, from initial to final. It is generally preferred that the test head be aligned in five degrees of freedom before the fragile electrical contacts make mechanical contact. The test head may then be urged along a straight line, which corresponds to the sixth degree of freedom, that is normal to the plane of the interface (typically the plane of the probe card or DUT board); and the contacts will make connection without any sideways scrubbing or forces which can be damaging to them.

As the docking actuator is operating, the test head is typically free to move compliantly in several if not all of its axes to allow final alignment and positioning. For manipulator axes which are appropriately balanced and not actuator driven, this is generally not a problem. However, actuator driven axes generally require that compliance mechanisms be built into them. Some typical examples are described in U.S. Pat. Nos. 5,931,048 to Slocum et al and 5,949,002 to Alden. Often compliance mechanisms, particularly for non-horizontal unbalanced axes, involve spring-like mechanisms, which in addition to compliance add a certain amount of resilience or "bounce back." Further, the cable connecting the test head with the ATE mainframe is also resilient. As the operator is attempting to maneuver the test head into approximate alignment and into a position where it can be captured by the docking mechanism, he or she must overcome the resilience of the system, which can often be difficult in the case of very large and heavy test heads. Also, if the operator releases the force applied to the test head before the docking mechanism is appropriately engaged, the resilience of the compliance mechanisms may cause the test head to move away from the dock. This is sometimes referred to as a bounce back effect.

An exemplary positioner system utilizing motor driven, six degrees of freedom adjustment is illustrated in U.S. Pat. No. 7,235,964, which is incorporated herein by reference.

SUMMARY OF THE INVENTION

In one aspect, the present invention provides an apparatus for supporting a device, comprising a base assembly, a plurality of carrier columns extending from the base unit, and a plurality of vertical support plates, each vertically moveable along a respective carrier column and including a pivotal device mounting bracket. A pneumatic unit including a piston rod is associated with each vertical support plate such that vertical motion of the piston rod controls vertical motion of the respective vertical support plate.

In another aspect, the present invention provides an apparatus for supporting a device, comprising a base assembly, a support assembly configured to support the device, and a plurality of compliant motion units positioned between the base assembly and the support assembly. Each compliant motion unit providing a range of motion in three horizontal degrees of freedom.

DETAILED DESCRIPTION OF THE INVENTION

Although the invention is illustrated and described herein with reference to specific embodiments, the invention is not intended to be limited to the details shown. Rather, various modifications may be made in the details within the scope and range of equivalents of the claims and without departing from the invention.

Figure 1:
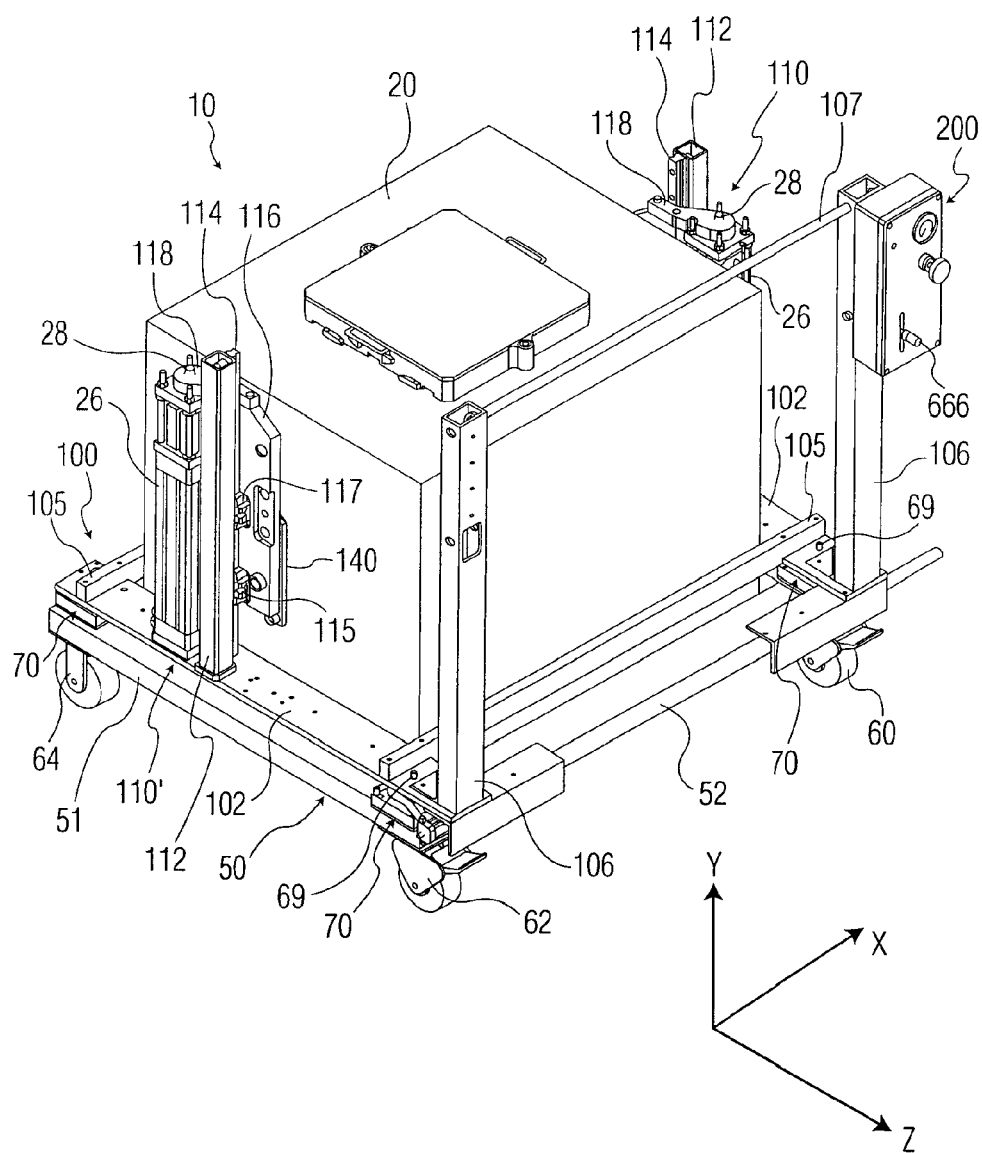
FIG. 1 is a left, rear perspective view of a positioner system according to an exemplary embodiment of the present invention with an exemplary test head positioned thereon in a lowermost position.

When used herein, the following words and phrases have the meaning provided. Rear shall indicate the side of the positioner system 10 including the operator handle and front shall indicate the opposite side there from. Left and right shall indicate the directions when looking at the positioner system 10 from the rear. Up, upper, upward, above, down, lower, downward, below, underlying, and the like indicate the directions relative to the positioner system 10 as shown in FIG. 1. These words and phrases are utilized herein only for a clearer understanding of the drawings and are not intended to limit the orientation or positioning of components of the present invention unless specifically indicated.

Figure 2:
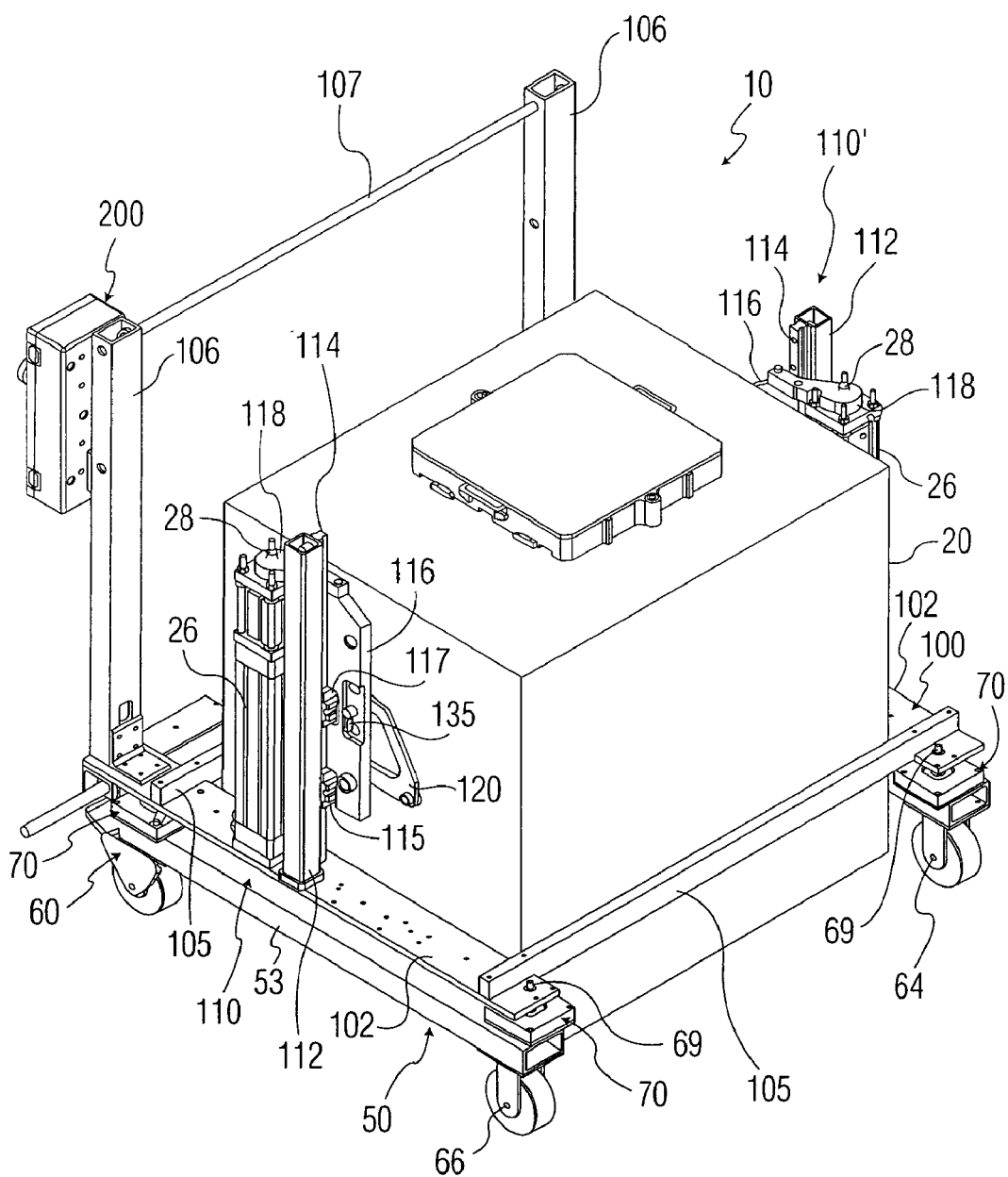
FIG. 2 is a right, front perspective view of the positioner system of FIG. 1 with the test head positioned thereon in a lowermost position.
Figure 3:
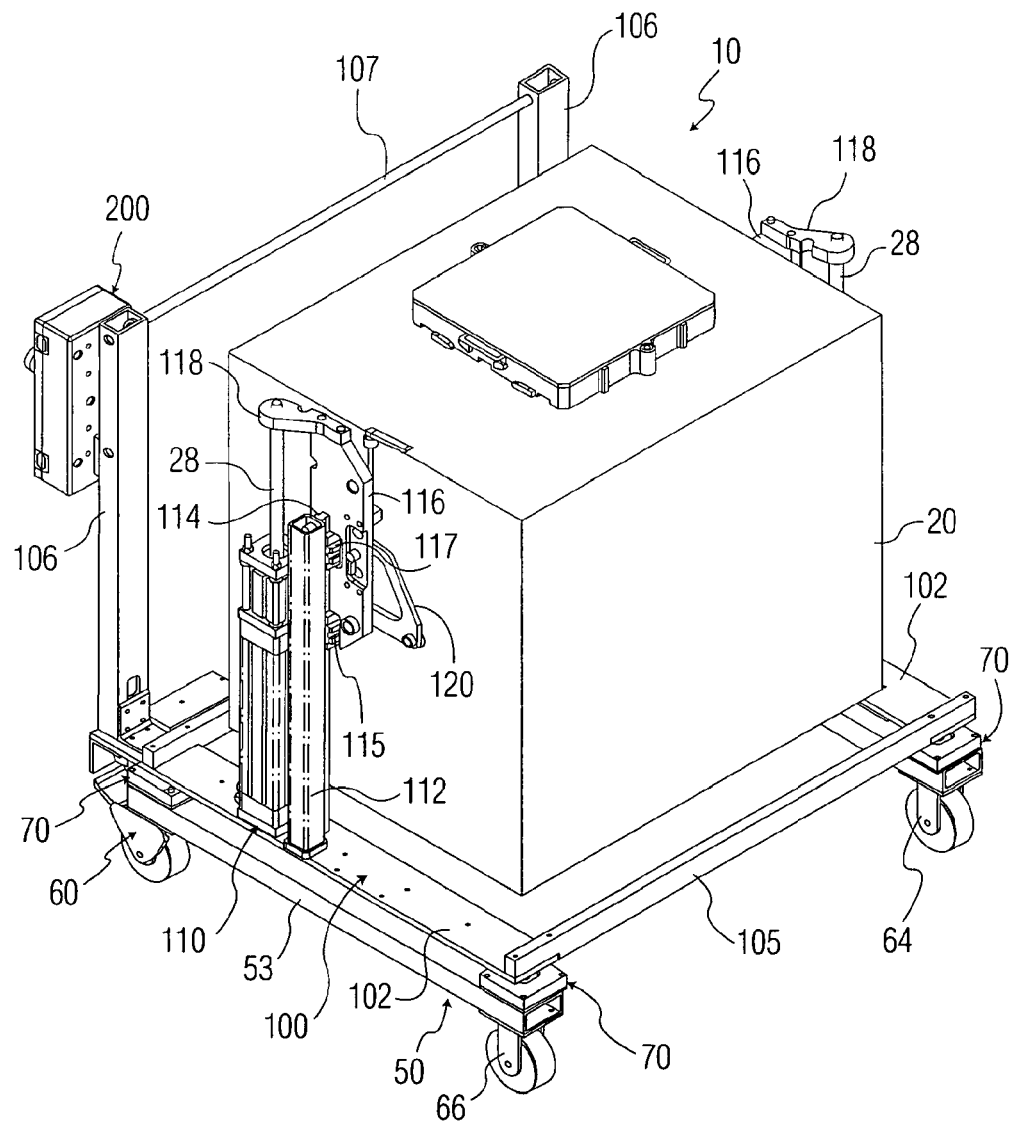
FIG. 3 is a right, front perspective view similar to FIG. 2 with the test head in a raised position.
Figure 4:
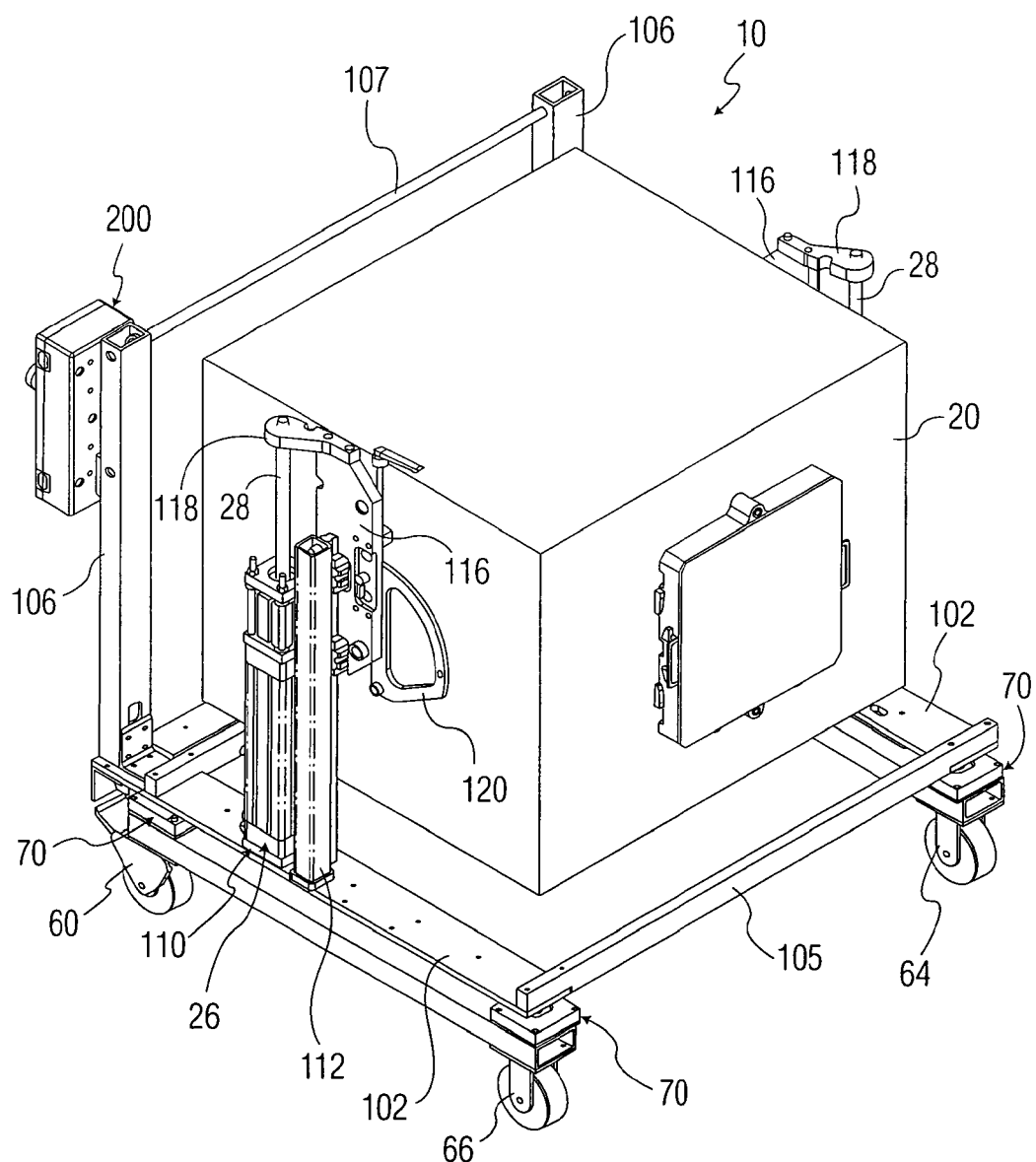
FIG. 4 is a right, front perspective view similar to FIG. 3 with the test head in a raised position and rotated to a dut-vertical orientation.

FIGS. 1-4 are perspective views of a positioner system 10 according to an exemplary embodiment of the present invention holding a test head 20 in various positions and orientations. FIGS. 1-3 show the test head 20 in a dut-up orientation while FIG. 4 shows the test head 20 in a dut-vertical orientation. The positioner system 10 in accordance with an exemplary embodiment of the invention facilitates positioning of the test head 20 with dock-from-below package handlers, horizontal-plane package handlers or vertical-plane handlers. The invention is however not limited to use with such handlers and may be utilized in other applications.

Figure 6:
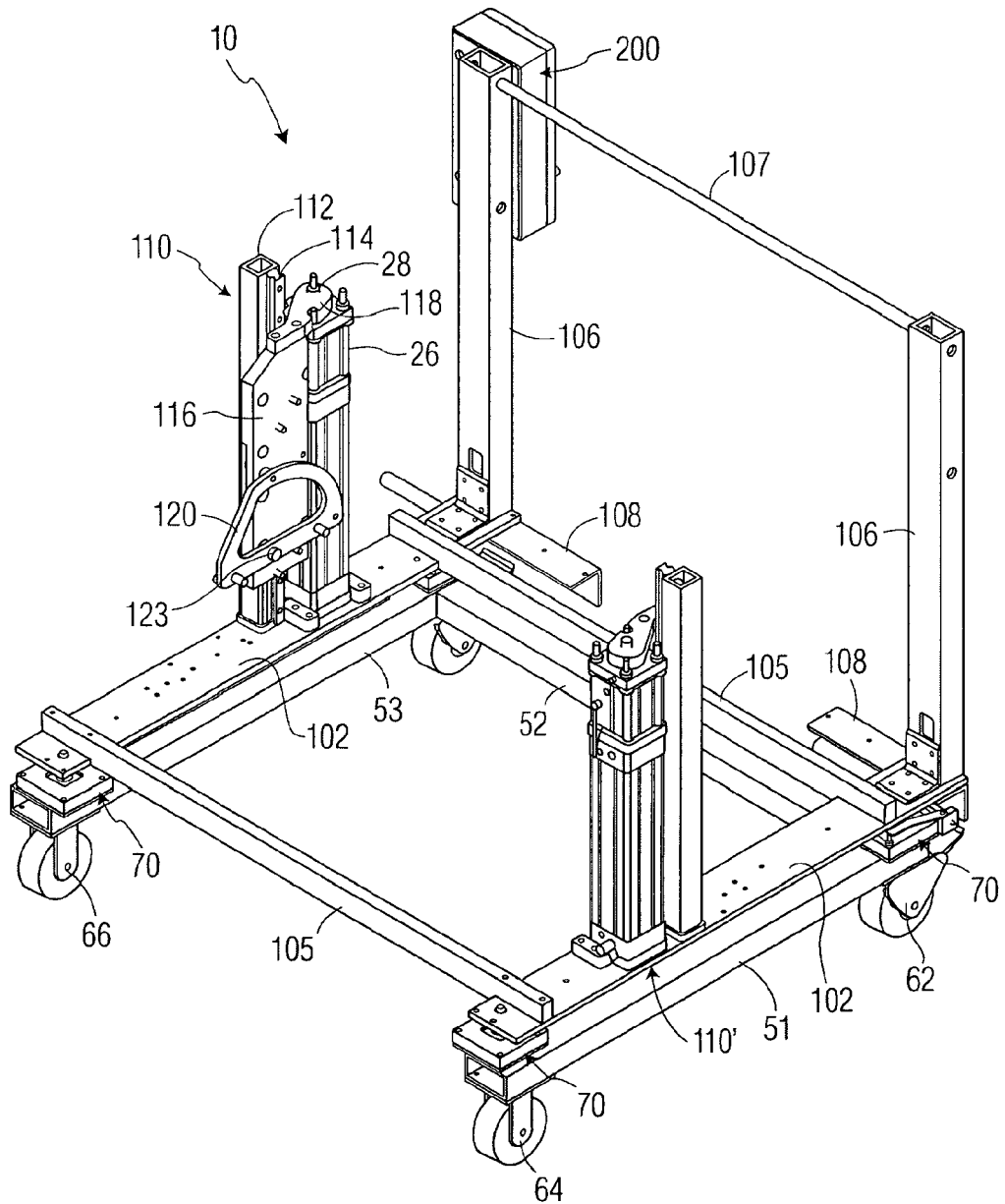
FIG. 6 is a right, front perspective view of the positioner system of FIG. 1 with the test head removed.

A positioner system 10 is used for holding and moving a heavy load such as a test head 20 which is more fully described in U.S. Pat. No. 4,527,942, which is incorporated by reference. As shown in FIG. 6 of that patent, six degrees of motion freedom are defined. The positioner system 10 in accordance with an exemplary embodiment of the present invention accomplishes these six degrees of motion freedom.

Figure 5:
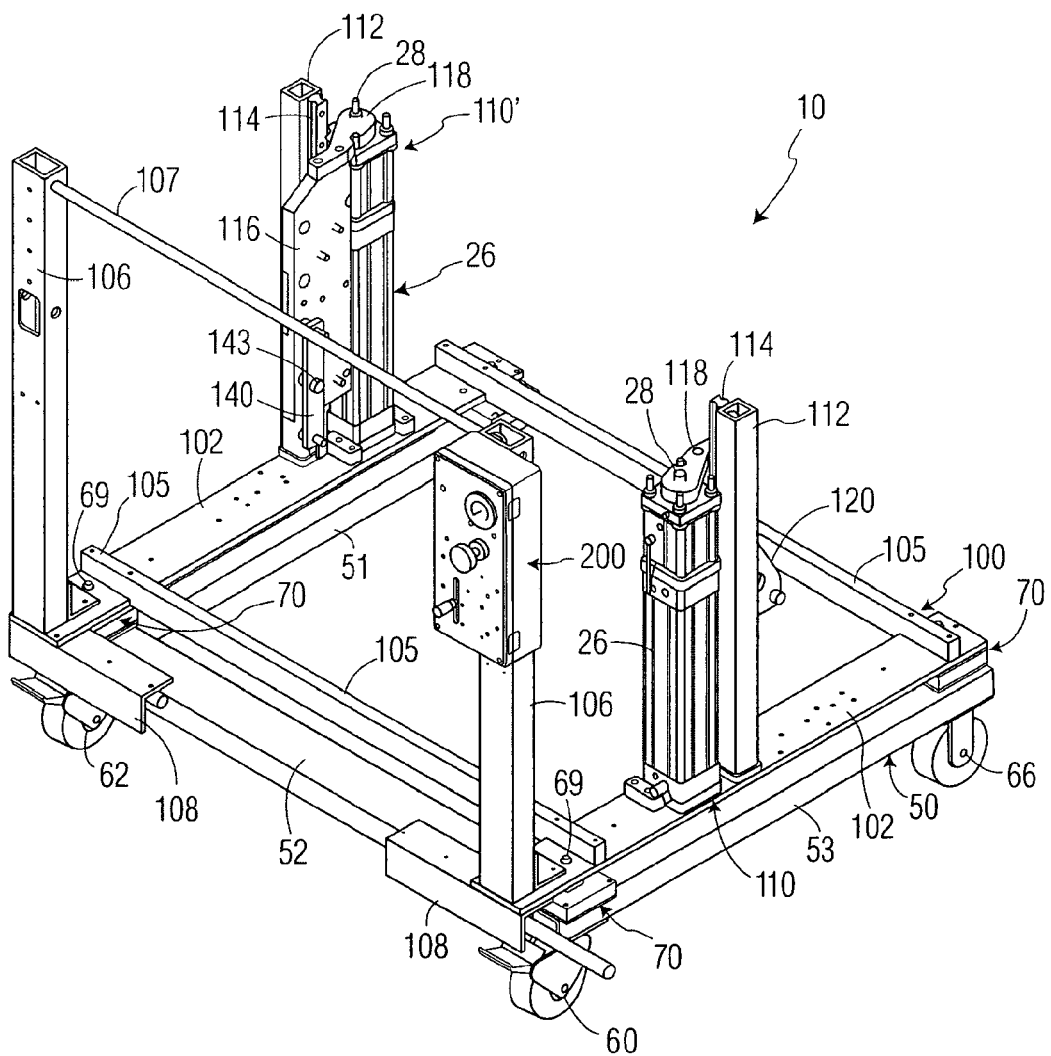
FIG. 5 is a right, rear perspective view of the positioner system of FIG. 1 with the test head removed.
Figure 7:
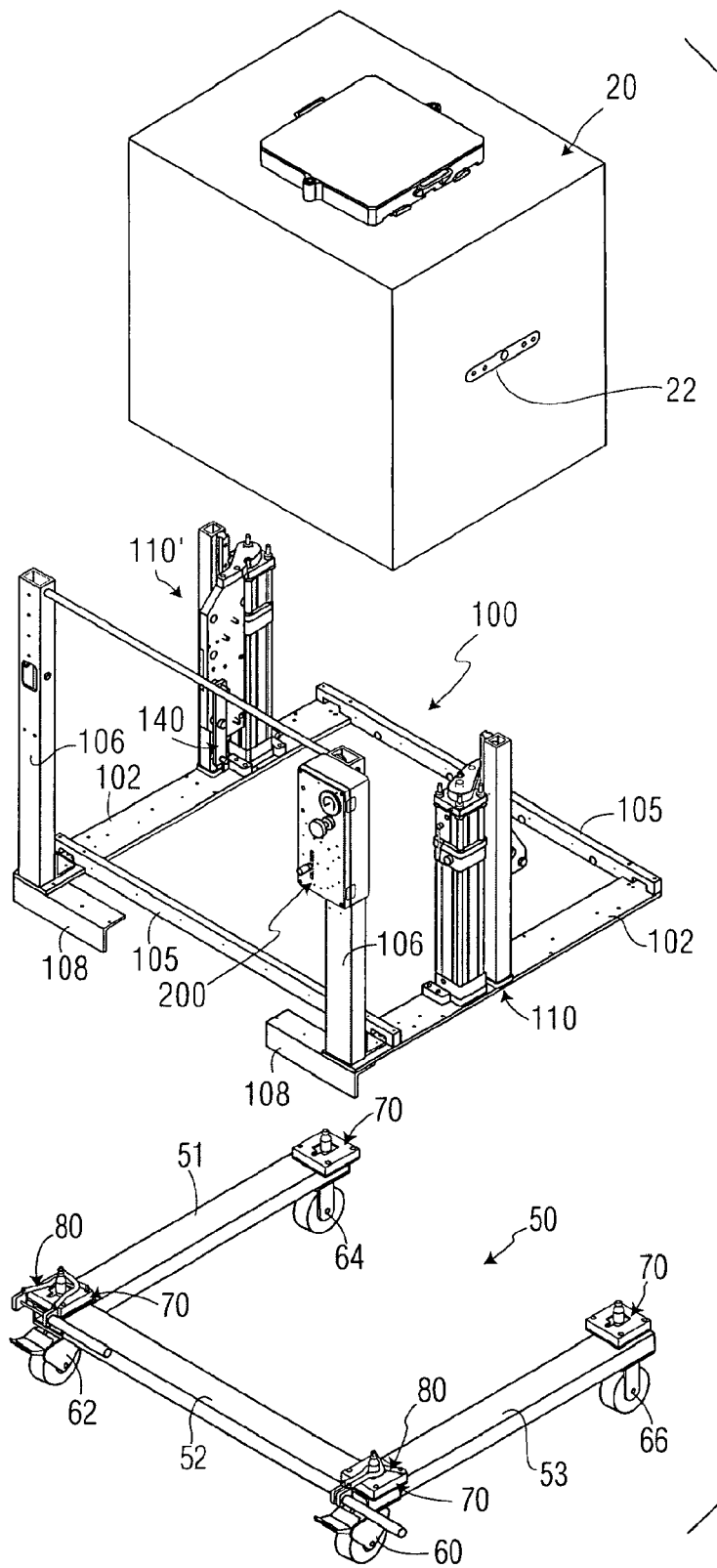
FIG. 7 is a partially exploded right, rear perspective view of the positioner system shown in FIG. 1.
Figure 8:
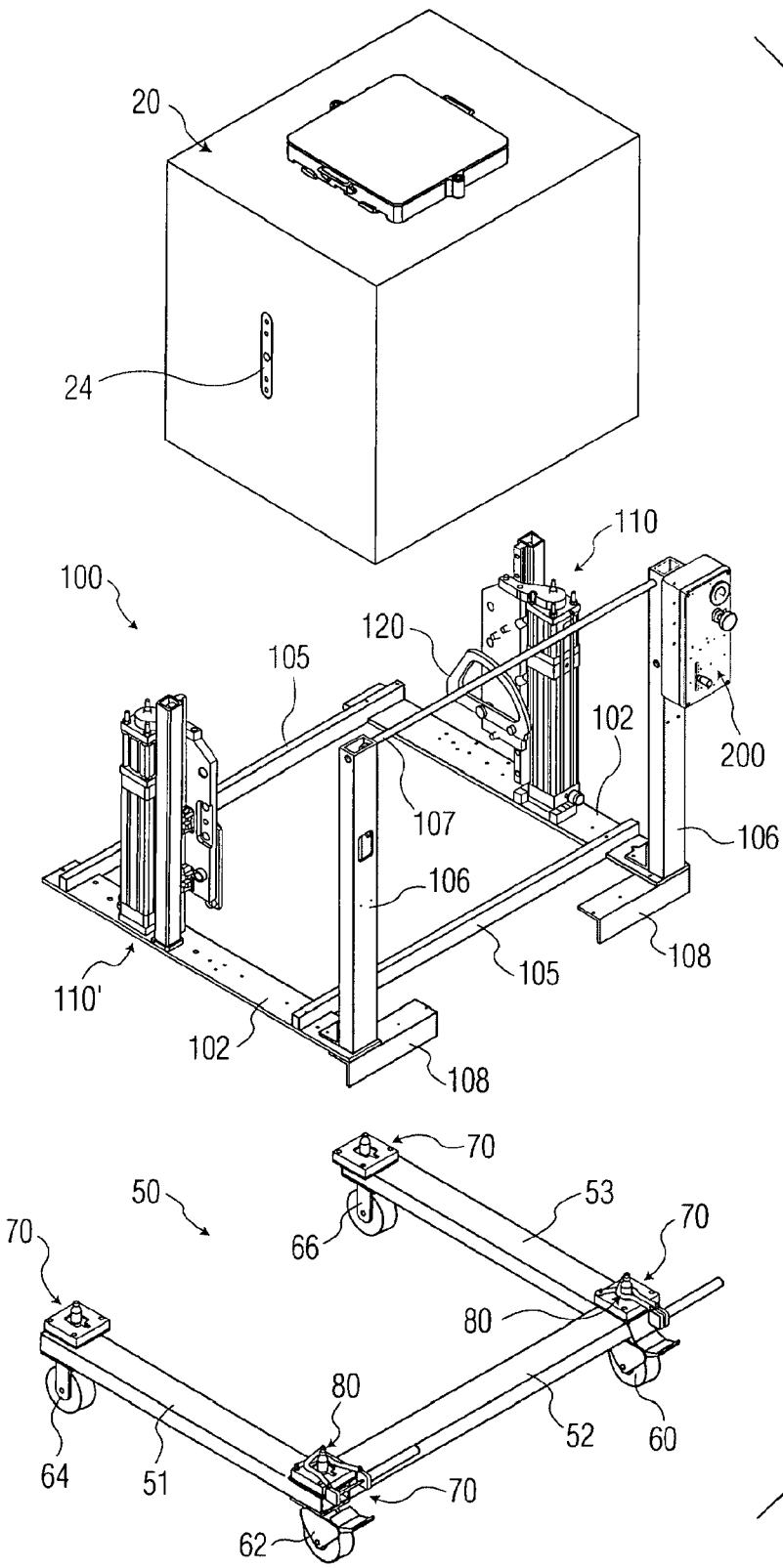
FIG. 8 is a partially exploded left, rear perspective view of the positioner system shown in FIG. 1.

FIGS. 5 and 6 are perspective views of the positioner system 10 shown in FIG. 1 with the test head 20 removed, and FIGS. 7 and 8 are exploded perspective views of the positioner system 10 shown in FIG. 1. As shown, the positioner system 10 generally comprises a base assembly 50 and a support assembly 100. The base assembly 50 is configured to roll upon the floor and provides three degrees of motion freedom in the horizontal plane, namely, in-out motion; side-to-side motion; and rotation about a vertical axis. The support assembly 100 provides compliant motion in the remaining three degrees of freedom, namely, up-down motion; roll; and tumble or pitch. The exemplary positioner system 10 also includes a control panel 200 as will be described hereinafter.

Figure 9:
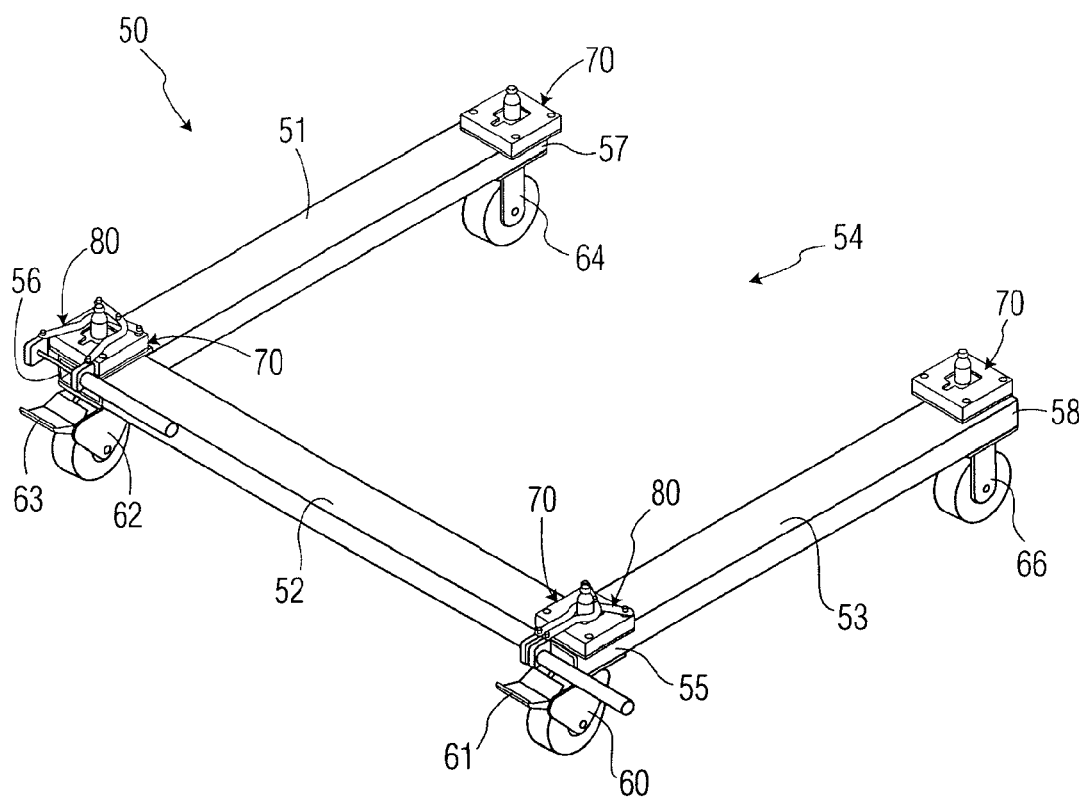
FIG. 9 is top right, rear perspective view of the base assembly of the positioner system shown in FIG. 1.
Figure 10:
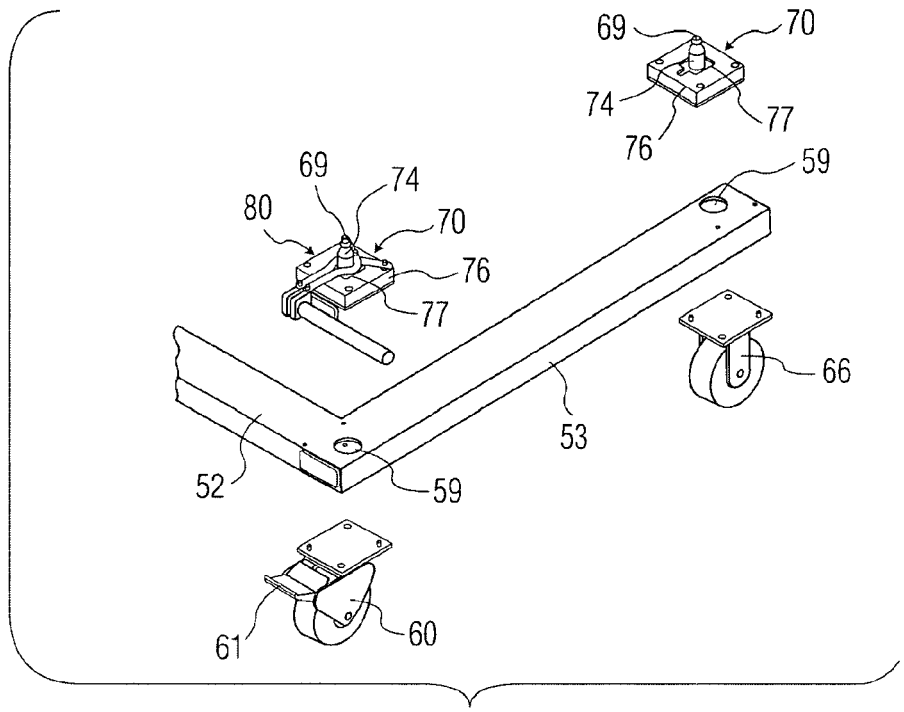
FIG. 10 is a partially exploded top right, rear perspective view of the base assembly of FIG. 9.
Figure 11:
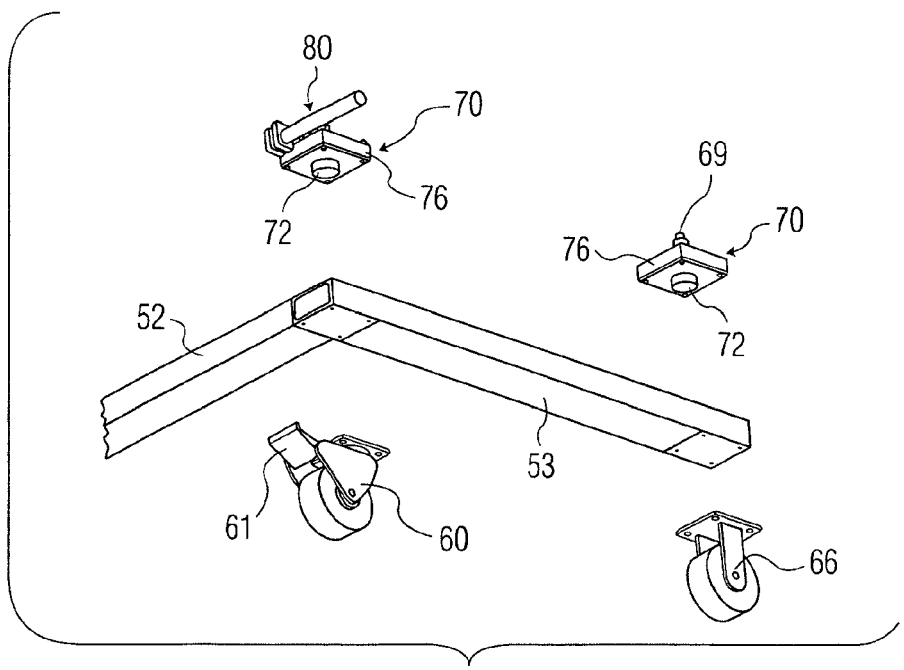
FIG. 11 is a partially exploded bottom right, rear perspective view of the base assembly of FIG. 9.

An exemplary base assembly 50 will be described with reference to FIGS. 9-11. Referring to FIG. 9, the exemplary base assembly 50 has a generally u-shaped configuration defined by a rear rail 52 extending between a pair of side rails 51 and 53, with the side opposite the rear rail 52 defining an open side 54. The open side 54 helps to facilitate mounting of the test head 20 to the positioning system 10, as described hereinafter. The rails 51-53 define four corners 55-58, namely, rear corners 55 and 56, and front corners 57 and 58 at the front ends of the side rails 51 and 53, respectively. A respective caster 60, 62, 64, 66 is attached to the base assembly 50 at each corner 55-58. The front casters 64 and 66 are preferably fixed direction casters and the rear casters 60 and 62 are preferably swivel casters. The casters 60, 62, 64, 66 enable an operator to push the positioner system 10 around and position it with respect to the test peripheral. The rear casters 60, 62 have foot actuated locks 61, 63 to allow the operator to lock the base assembly 50 in a desired position with respect to the test peripheral. Any combination of rigid and swivel casters may alternatively be used as may best fit a specific application. Additionally, swivel casters that include the option to allow the operator to lock out the swivel motion while retaining linear motion may also be used. Such casters are commercially available and well known. The locking-out swivel feature may be useful, for example, in vertical plane docking when the manipulator has been correctly positioned and aligned in five degrees of freedom and straight-line motion of the casters is required for final docking.

Movement and locking of the base assembly 50 relative to the test peripheral provides macro-compliant motion in the three horizontal plane degrees of freedom, namely, in-out motion; side-to-side motion; and rotation about a vertical axis. The exemplary base assembly 50 is further configured to provide micro-compliant motion in the three horizontal plane degrees of freedom. To facilitate such, a compliance mounting unit 70 is provided at each corner 55-58. Each of the compliance mounting units 70 may have the same construction. Referring to FIGS. 1 and 2, the load support plates 102 of the support assembly 100 are attached to and supported by the compliant mounting units 70, thereby providing such micro-compliant motion to the support assembly 100.

Figure 12:
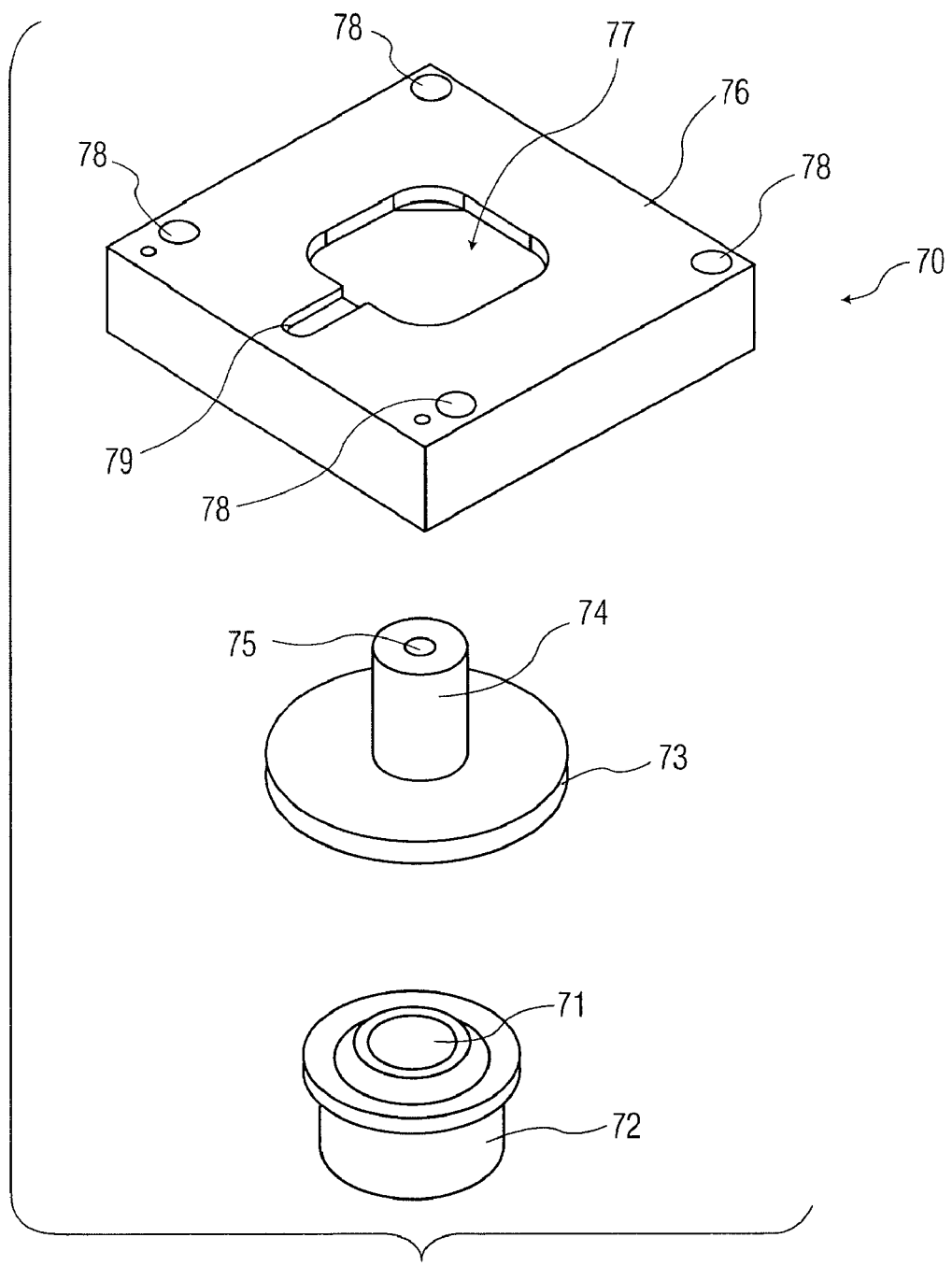
FIG. 12 is an exploded perspective view of a compliant mounting unit of the base assembly of FIG. 9.
Figure 13:
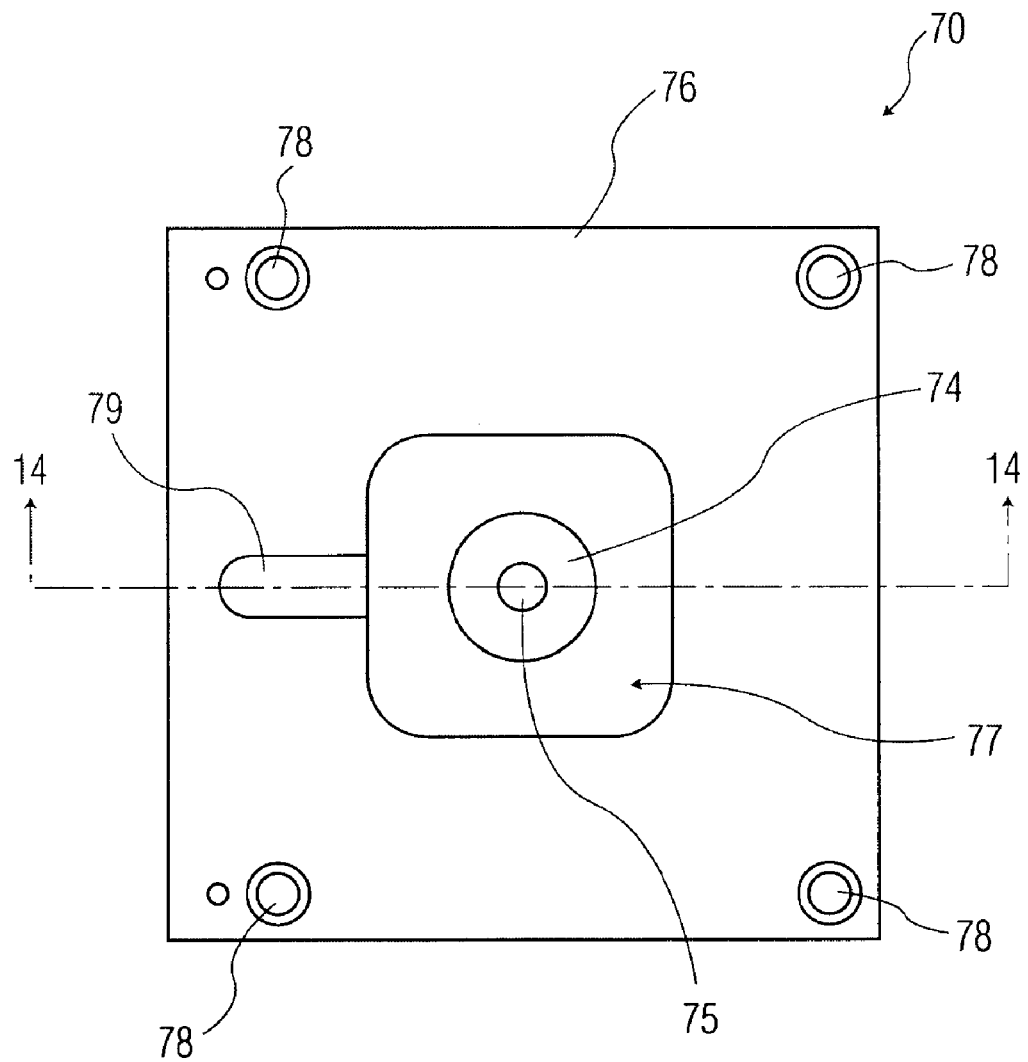
FIG. 13 is a top plan view of the compliant mounting unit of FIG. 12.
Figure 14:
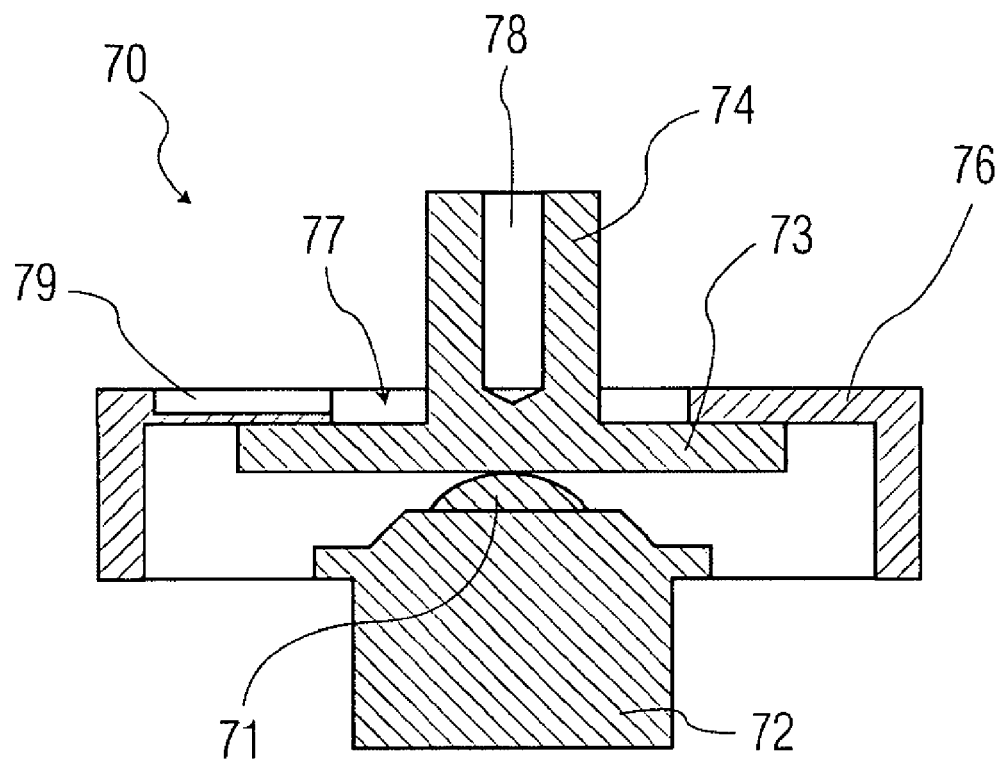
FIG. 14 is a cross-sectional view along the line 14-14 in FIG. 13.

An exemplary compliant mounting unit 70 is illustrated in FIGS. 12-14. The compliant mounting unit 70 includes a housing 76 positioned about a ball 71 supported in a ball holder 72. The ball 71 is generally freely rotatable relative to the ball holder 72. A support disk 73 is positioned between the housing 76 and the ball 71 and is supported by the ball 71. Because the ball 71 is freely rotatable, the support disk 73 supported thereon is horizontally freely moveable within the constraints defined by the housing 76. A load support post 74 extends from the support disk 73 through a range of motion aperture 77 defined through the housing 76. The support post 74 has an outside diameter less than the inside diameter of the range of motion aperture 77 such that the support post 74 has limited motion relative to the housing 76. Contact of the support post 74 with the edges of the range of motion aperture 77 defines the range of motion of the support disk 73 and support post 74. The illustrated range of motion aperture 77 has a rounded square configuration, but may have other configurations. Each support post 74 has a tapped hole 75 configured to receive a socket head cap screw 69 (see FIGS. 1, 2 and 10) to secure a portion of a respective support assembly load support plate 102 relative thereto.

Referring again to FIGS. 9-11, each compliant mounting unit 70 is secured to a respective corner 55-58 of the base assembly 50. The side rails 51, 53 preferably have corresponding apertures 59 configured to receive the bottom portion of a respective ball holder 72. The housing 76 may include screw holes 78 for securing of the compliant mounting unit 70 to a respective rail 51, 53. The compliant mounting units 70 positioned on the base assembly 70 allow the test head 20 support assembly 100 to freely move over a limited range of motion in the three degrees of freedom in the horizontal plane, thus, providing the desired micro-compliant motion necessary for docking.

At times it may be desirable or necessary to center the test head 20 with respect to these horizontal degrees of freedom. As illustrated in FIG. 9, the base assembly 50 includes centering units 80 on two of the compliant mounting units 70. The centering units 80 are illustrated on the compliant mounting units 70 positioned at the rear corners 55 and 56, but may be otherwise positioned. Additionally, the invention is not limited to two centering units.

An exemplary pneumatic centering unit 80 will be described with reference to FIGS. 15-18. The centering unit 80 includes a pair of opposed blades 81 and 82. Preferably, the blades 81 and 82 have the same configuration and are simply oriented inverted to one another, but they may alternatively have differing configurations. In the present embodiment, each blade 81, 82 has a housing connection portion 83, a actuator connection portion 85 and a curved centering portion 84 therebetween. Each housing connection portion 83 is pivotally connected to the housing 76 at a pivot point 86. Each actuator connection portion 85 is pivotally connected to a respective actuator plate 91, 92 at a pivot point 88. A scissor screw 89 passes through both housing connection portions 83 and is received in a slot 79 on the housing 76. The scissor screw 89 is free to move along the slot 79 (compare FIGS. 17 and 18) to guide a scissor motion between the opposed blades 81 and 82.

Figure 15:
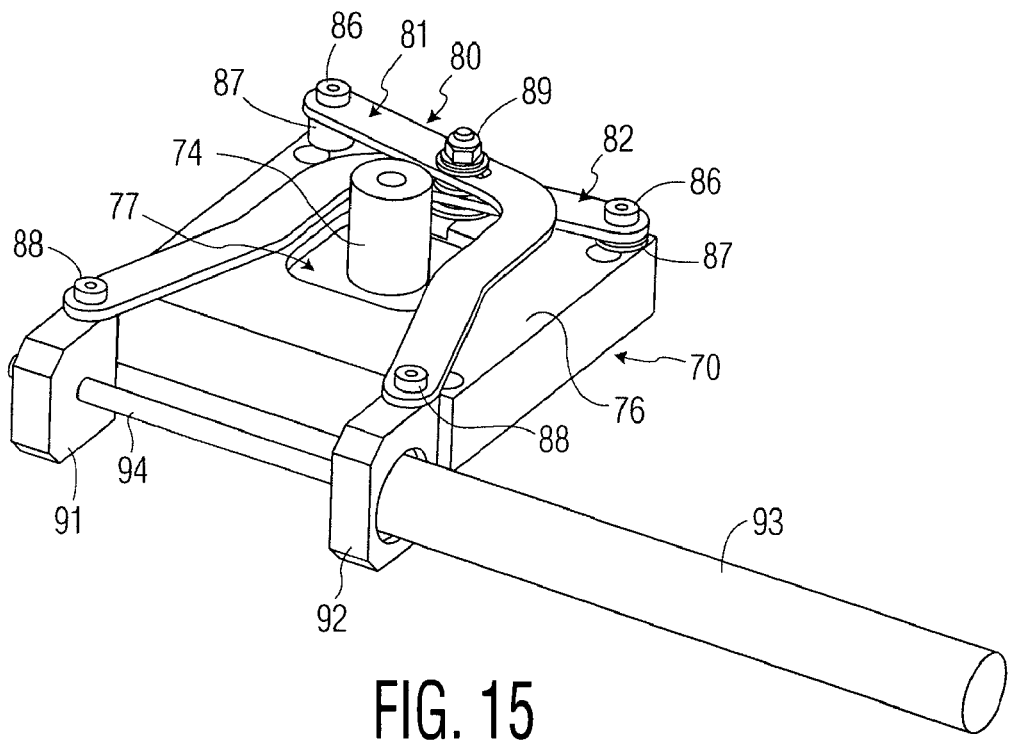
FIG. 15 is a perspective view of a compliant mounting unit with a pneumatic centering unit in a compliance position.
Figure 17:
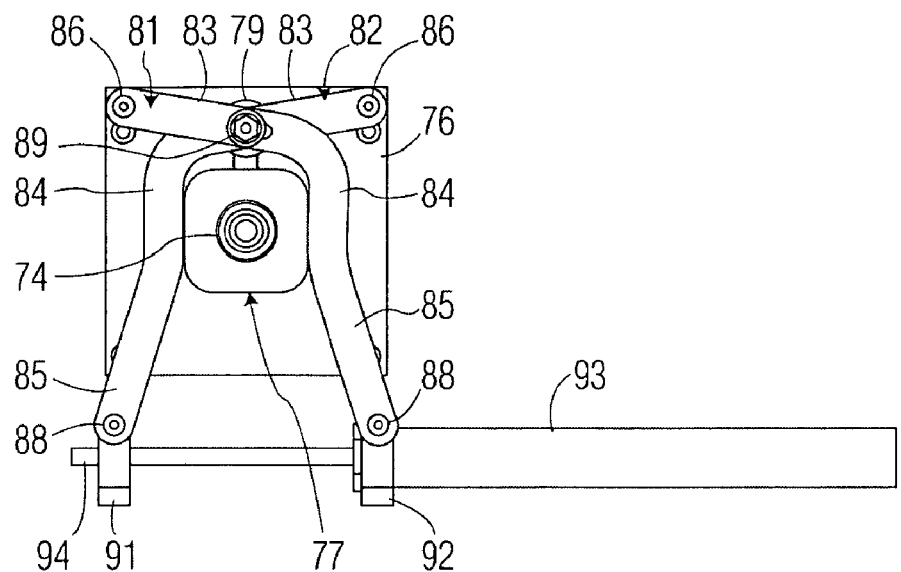
FIG. 17 is a top plan view of the compliant mounting unit with the pneumatic centering unit in the compliance position.

Referring to FIGS. 15 and 17, the centering unit 80 is shown in a compliance position wherein the support post 74 is free to move within the range of motion aperture 77. The blades 81 and 82 are configured such that in this position, the curved centering portions 84 of the blades 81, 82 are outside of the perimeter of the range of motion aperture 77 and therefore do not interfere with the free motion of the support post 74.

Figure 16:
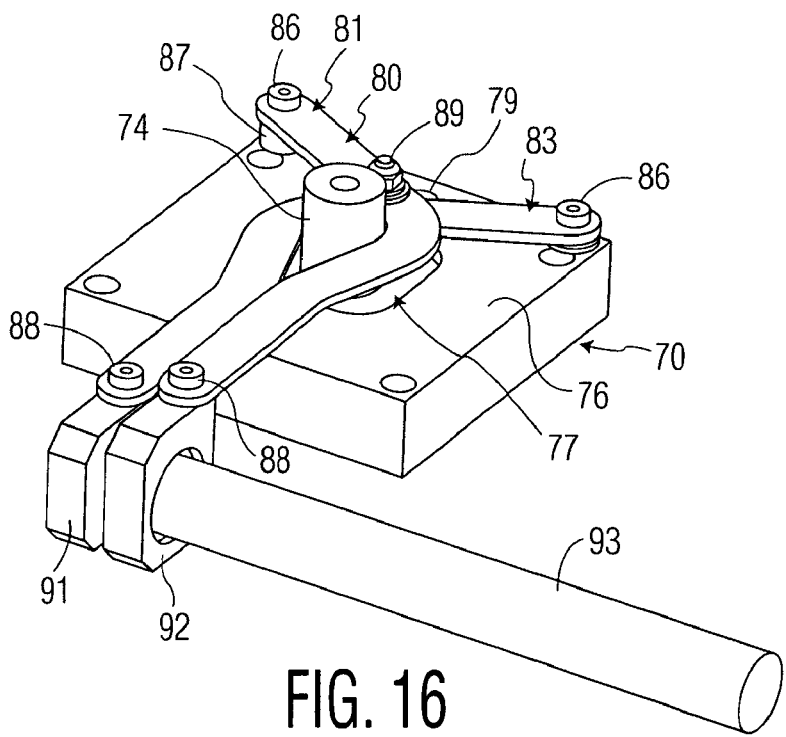
FIG. 16 is a perspective view of the compliant mounting unit with the pneumatic centering unit in a locked position.
Figure 18:
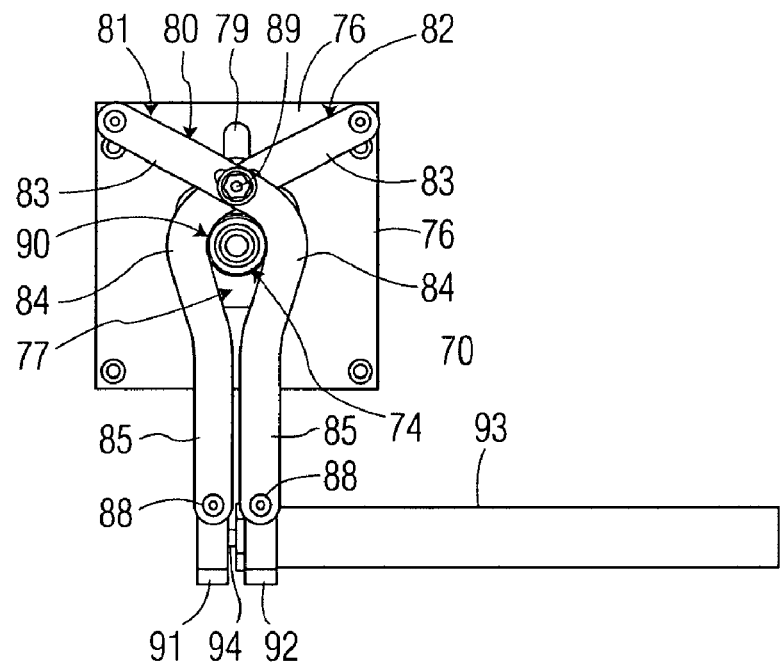
FIG. 18 is a top plan view of the compliant mounting unit with the pneumatic centering unit in the locked position.

Referring to FIGS. 16 and 18, the centering unit 80 is shown in a locked position wherein the support post 74 is centered relative to the range of motion aperture 77 and prevented from moving. The blades 81 and 82 are configured such that in this position, the curved centering portions 84 of the blades 81, 82 are brought together to define a confinement area 90 that is centered relative to the range of motion aperture 77. As the blades 81 and 82 are moved from the compliance position to the locked position, one or both of the blades 81, 82 contact the support post 74 and move the support post 74 to the confinement area 90, thereby centering the support post 74 within the range of motion aperture 77. Preferably, the blades 81 and 82 are locked in this position such that the support post 74 remains secured in such position.

In the present embodiment, a pneumatic cylinder 93 is utilized to move the blades 81 and 82 between the compliance position and the locked position. Referring to FIGS. 15 and 17, one of the actuator plates 92 is fixed to the pneumatic cylinder 93 and the other actuator plate 91 is fixed to the piston rod 94. The pneumatic cylinder 93 is configured such that it is fluidly controlled to extend and retract the piston rod 94. In the compliance position, the cylinder 93 is preferably deactivated such that the piston rod 94 is free to extend and the actuator plates 91 and 92 are spaced apart, thereby separating the blades 81 and 82. When centering is desired, the pneumatic cylinder 93 is actuated to retract the piston rod 94. As the piston rod 94 is retracted, the actuator plates 91 and 92 are drawn together, thereby causing the blades 81 and 82 to scissor about the pivot points 86, 88 and define the confinement area 90. Once centered, the pneumatic cylinder 93 may stay actuated to keep the load centered within its compliant range. To return to compliant mode, which requires little force, the pneumatic cylinder 93 is deactivated. Preferably, each of the centering units 80 (see FIG. 9) is actuated or deactivated simultaneously, although such is not required. A pneumatic control for the centering units 80 may be provided on the control panel 200, as described in more detail hereinafter.

Figure 19:
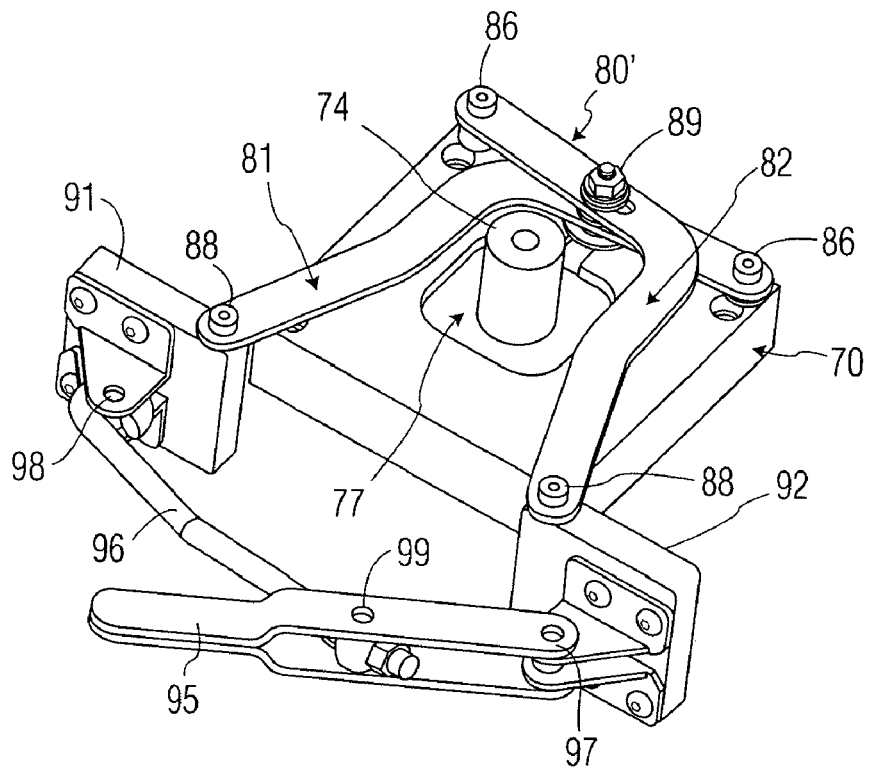
FIG. 19 is a perspective view of a compliant mounting unit with a mechanical centering unit in a compliance position.
Figure 20:
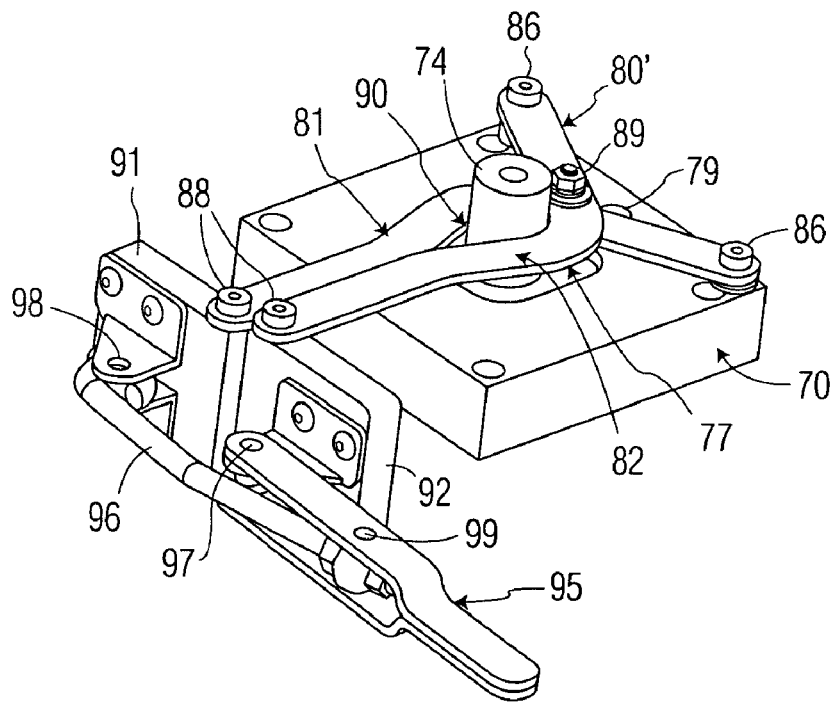
FIG. 20 is a perspective view of the compliant mounting unit with the mechanical centering unit in a locked position.

Referring to FIGS. 19 and 20, an exemplary mechanical centering unit 80' is illustrated. The mechanical centering unit 80' is substantially the same as the pneumatic centering unit 80, except that the pneumatic cylinder 93 and piston rod 94 are replaced with a mechanical clamp assembly. Like features are numbered alike in the various figures. The centering unit 80' includes a clamp handle 95 that is pivotally connected 97 at one end to the actuator plate 92. A clamp linkage 96 is pivotally connected 98 at one end to the actuator plate 91 and pivotally connected 99 at its opposite end to a mid portion of the clamp handle 95. As shown in FIG. 19, as the clamp handle 95 is pivoted toward the actuator plate 91, the actuator plates 91 and 92 are spaced apart, thereby separating the blades 81 and 82. As shown in FIG. 20, as the clamp handle 95 is pivoted in the opposite direction, the actuator plates 91 and 92 are drawn together, thereby causing the blades 81 and 82 to scissor about the pivot points 86, 88 and define the confinement area 90. The clamp linkage 96 is preferably configured such that the centering unit 80' remains locked in the centering position upon movement of the clamp handle 95 to the position shown in FIG. 20. In all other aspects, the centering unit 80' operates in the same manner as in the previous embodiment.

Figure 21:
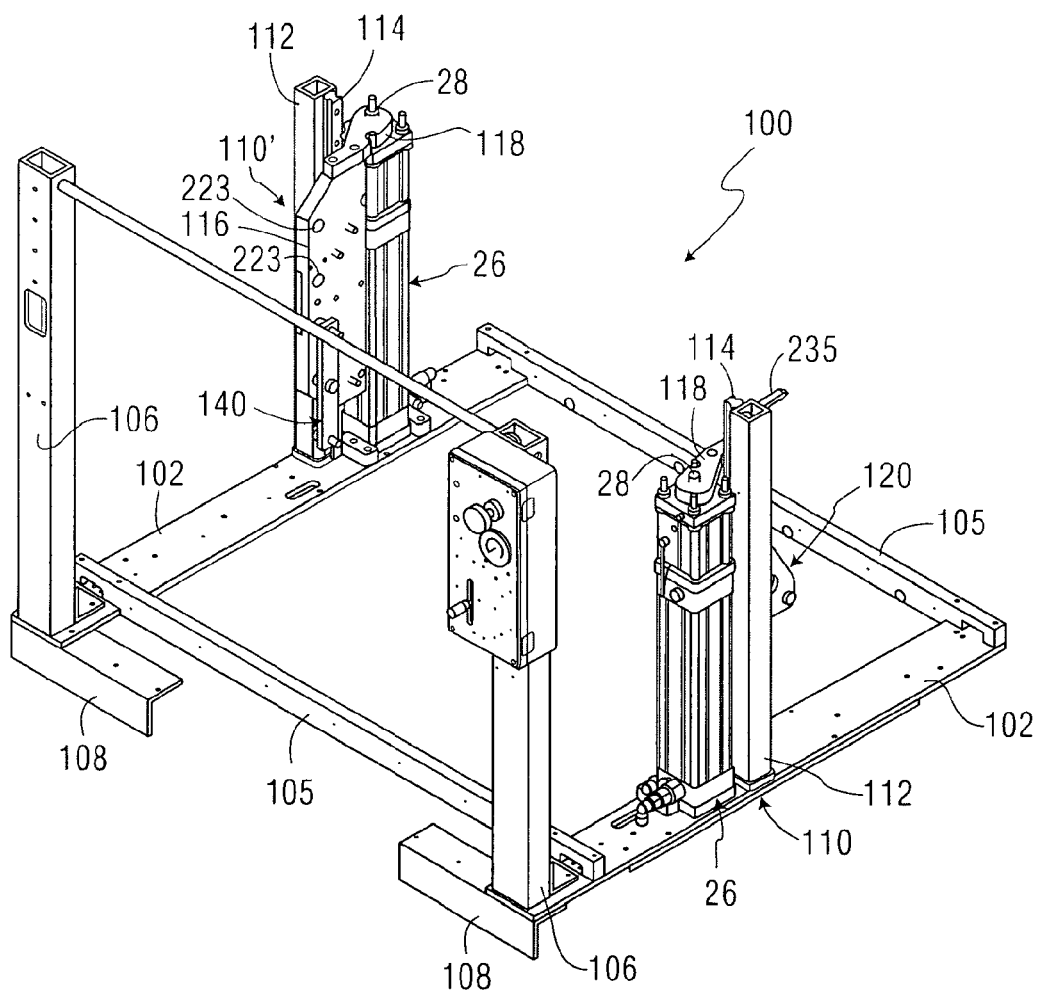
FIG. 21 is a perspective view of the support assembly of the positioner system of FIG. 1.
Figure 22:
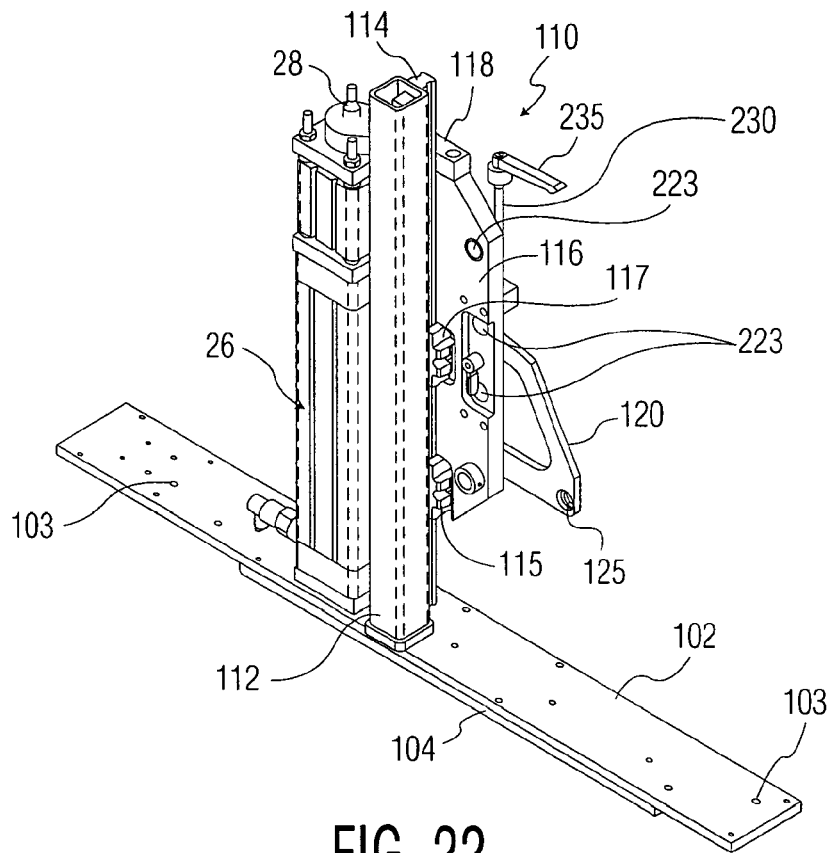
FIG. 22 is a perspective view illustrating the rail side of a first vertical support of the support assembly.
Figure 23:
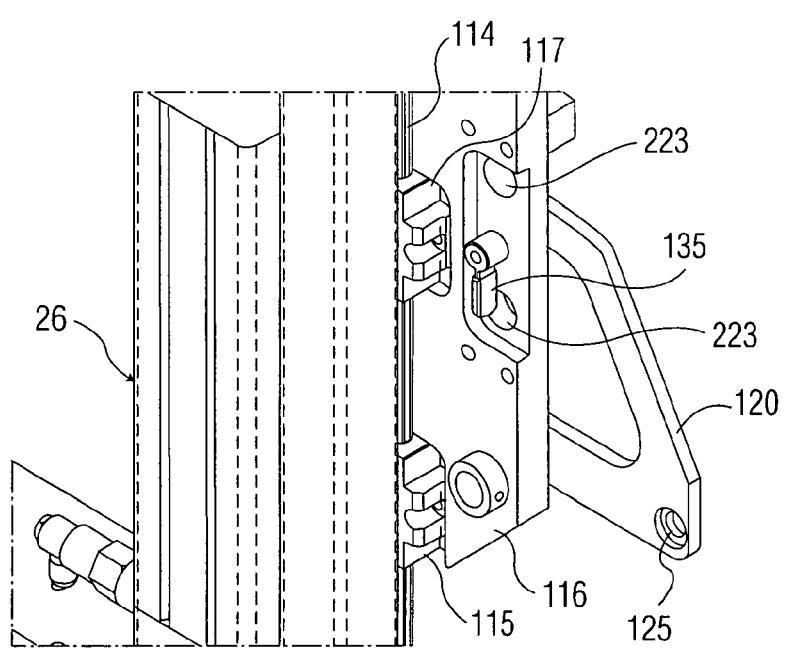
FIG. 23 is an enlarged perspective view of a portion of the first vertical support of FIG. 22.
Figure 24:
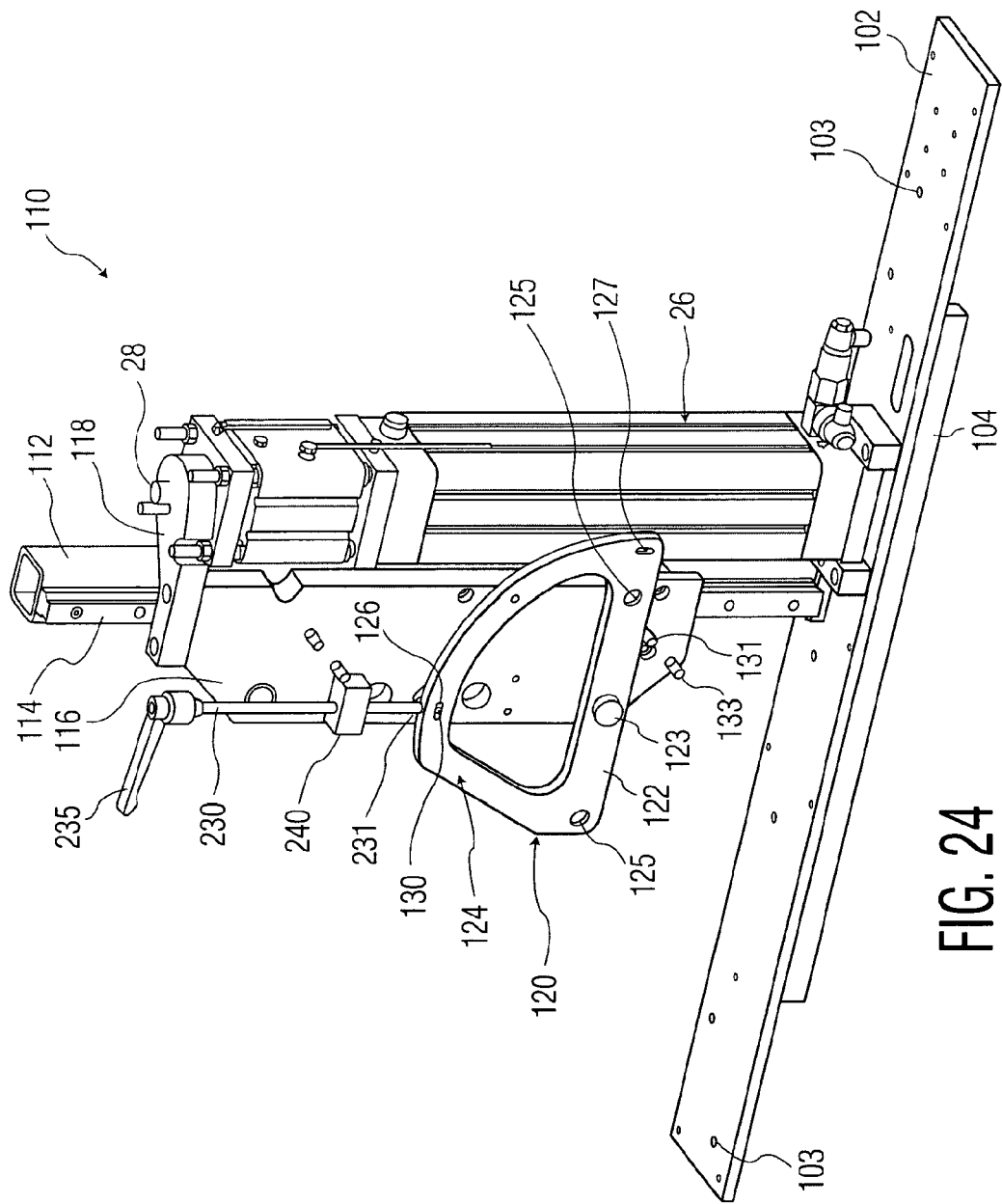
FIG. 24 is a perspective view illustrating the bracket side of the first vertical support.
Figure 25:
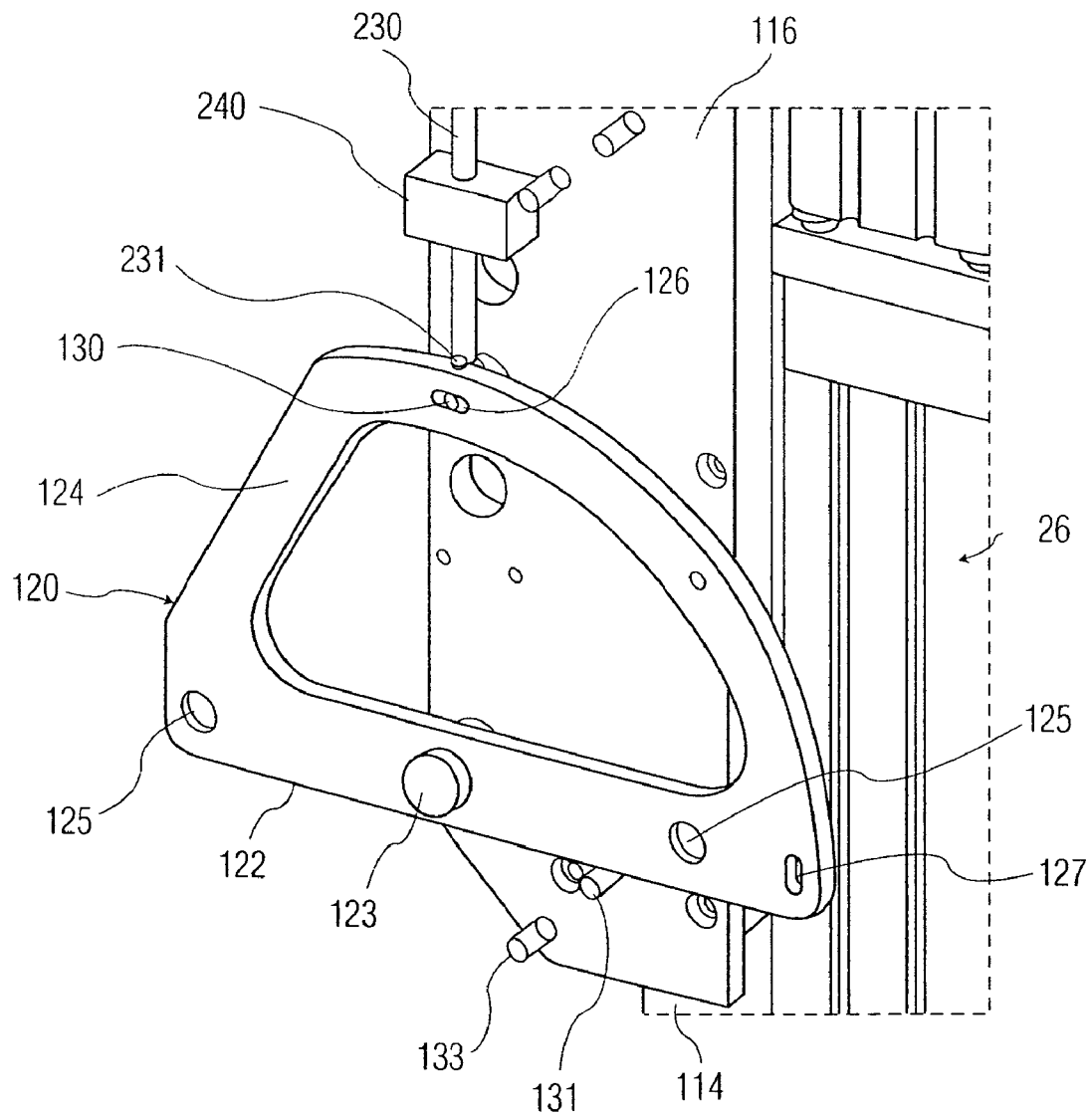
FIG. 25 is an enlarged perspective view of a portion of the first vertical support of FIG. 24.
Figure 26:
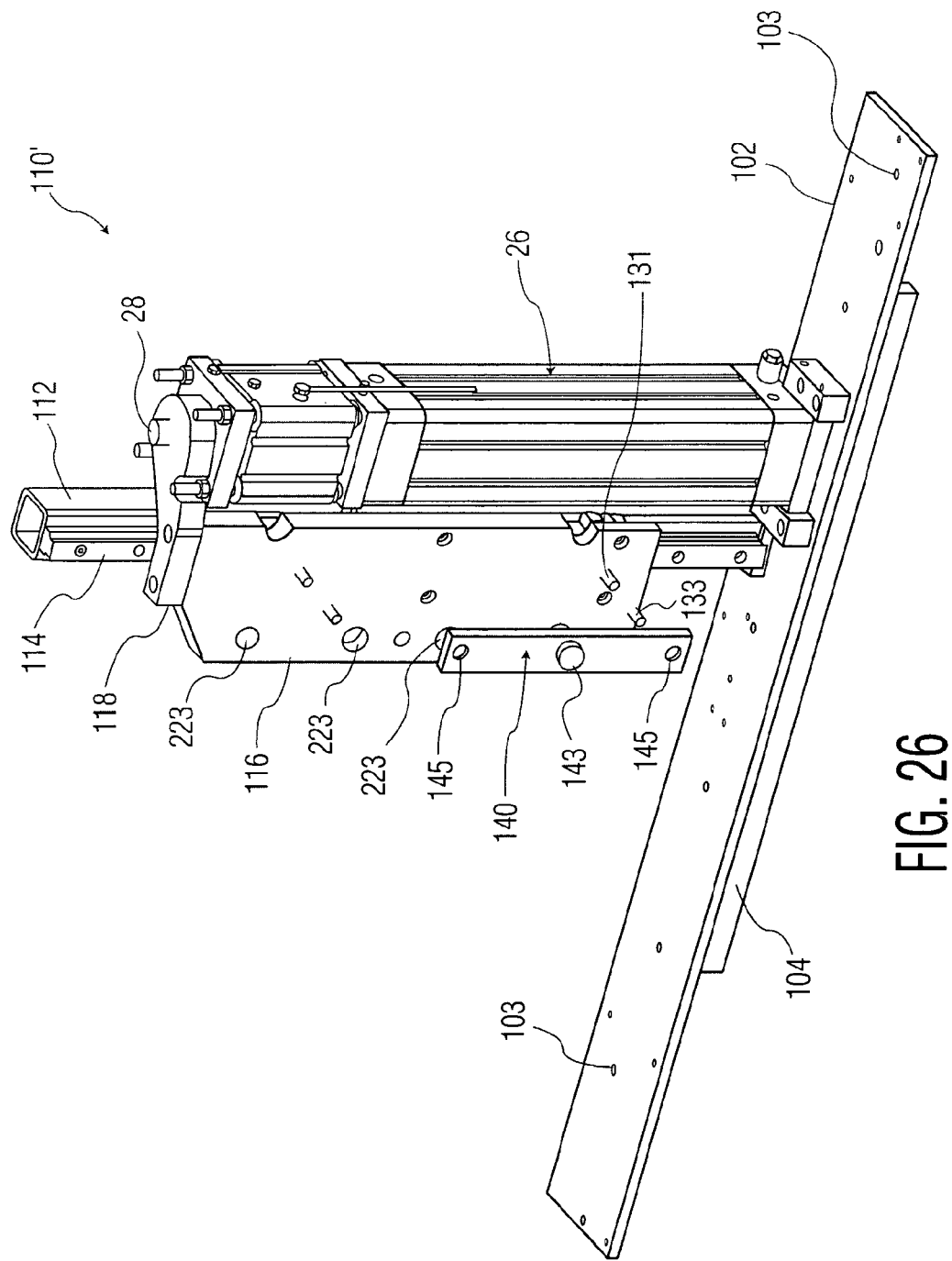
FIG. 26 is a perspective view illustrating the bracket side of a second vertical support of the support assembly.

An exemplary support assembly 100 will be described with reference to FIGS. 21-30. Referring to FIG. 21, the support assembly 100 generally comprises a pair of opposed load support plates 102 interconnected by a pair of cross braces 105. As illustrated in FIGS. 24 and 26, each load support plate 102 may include a reinforcement bar 104 positioned there along. Additionally, each load support plate 102 includes a pair of connection holes 103 adjacent the opposed ends and configured to receive a socket head cap screw 69 to secure the load support plate 102 to a respective compliant mounting unit 70. An upright 106 is mounted at the rear end of each load support plate 102 and an operator handle 107 extends between the uprights 106. As illustrated, the control unit 200 may be mounted to one of the uprights 106. An angle bar 108 may also be provided at the rear end of each load support plate 102. The angle bars 108 provide protection for the compliance equipment and may also be configured to provide an area for the operator to apply foot pressure to move the positioner system 10.

A vertical support 110, 110' extends up from each load support plate 102. The vertical supports 110 and 110' are alike except for the coupling brackets 120 and 140, respectively. Like features are numbered alike in the various figures. Referring to FIGS. 22-25, vertical support 110 will be described. Vertical support 110 includes a pneumatic unit 26 with a fluidly controlled piston rod 28. The pneumatic unit 26 and fluid control will be described in more detail hereinafter. Adjacent to the pneumatic unit 26 is a carrier column 112 which extends from the load support plate 102 and has an inwardly directed rail 114 extending there along. Referring to FIGS. 22 and 23, vertical mounting plate 116 includes a pair of linear bearings 115 and 117 which are configured to engage the rail 114 such that the vertical mounting plate 116 is vertically moveable along the rail 114. A coupling member 118 is interconnected between the vertical mounting plate 116 and the piston rod 28 of pneumatic unit 26. As such, fluidly controlled motion of the piston rod 28 will control vertical motion of the vertical mounting plate 116 to which the test head 20 is connected, as described hereinafter. These components described with respect to vertical support 110 are common to vertical support 110' as shown in FIGS. 21 and 26 and do not require further description.

Referring to FIGS. 22-25, vertical support 110 includes a coupling bracket 120 configured for connection to a mounting bracket 22 on one side of the test head 20 (see FIG. 7). Coupling bracket 120 is rotatably mounted to mounting plate 116 with an appropriate pivotal coupling 123 inserted into a suitably located bore in plate 116. As described hereinafter, vertical support 110' includes a second rotatable coupling bracket 140; the two brackets support test head 20 and enable it to rotate about a horizontal axis that is parallel to the X-axis in FIG. 1. Rotation about this axis is referred to as "tumble" motion and the axis may be called the "tumble axis." Tumble motion is one of the six degrees of freedom. Typically, the system is configured so that the tumble axis passes through the center of gravity of test head 20 so that it may rotate freely. The coupling bracket 120 provides limited compliant tumble motion, tumble lock, and a change-over capability between dut-up and dut-vertical orientations. The coupling bracket 120 includes a linear portion 122 and a curved portion 124. The linear portion 122 of the coupling bracket 120 is pivotally mounted to the vertical mounting plate 116 via a pivotal coupling 123. A pair of mounting bores 125 are provided along the linear portion 122 of the coupling bracket 120 and are configured to facilitate interconnection between the test head 20 mounting bracket 22 and the coupling bracket 120.

The coupling bracket 120 includes a pair of compliance slots 126 and 127 which are offset by approximately 90° relative to one another. Compliance slot 126 is configured to provide tumble compliance when the test head 20 is positioned in a dut-up orientation and compliance slot 127 is configured to provide tumble compliance when the test head 20 is positioned in a dut-vertical orientation. The pivotal coupling 123 of coupling bracket 120 allows a test head 20 to be moved between these orientations without removing the test head 20 from the positioner system 10. A first stop 131 extends from the vertical mounting plate 116 and provides a rotational stop for the coupling bracket 120 when such is in the dut-up orientation (as shown). A second stop 133 extends from the vertical mounting plate 116 and provides a rotational stop for the coupling bracket 120 when such is in the dut-vertical orientation.

To provide tumble compliance, a commercially available cam-actuated, spring-loaded plunger unit including plunger handle 135 and plunger rod 130 is attached to vertical mounting plate 116 of vertical support 110. This is used in conjunction with compliance slots 126 and 127, which are included in coupling bracket 120. Rod 130 is circular in cross section, and the width of slots 125 and 126 are slightly wider than the diameter of rod 130. With handle 135 in a first position, plunger rod 130 is withdrawn from engagement in either of slots 126 and 127, and test head 20 may be freely rotated between the dut-up and dut-vertical positions. When test head 20 is, for example, in the dut-up position, handle 135 may be rotated to a second position, which causes rod 130 to extend into slot 126. Similarly, when test head 120 is in the dut-vertical position, handle 135 may be rotated to the second position, causing rod 130 to extend into slot 127. With rod 130 extended into either of slots 126 and 127, the slots 126, 127 may move with respect to rod 130; and test head 20 may be compliantly rotated an amount limited by the lengths of the respective slots 126, 127. Slot 126 may be made having a length that differs from that of slot 127, allowing different amounts of tumble compliance in the dut-up and dut-vertical positions, if it is so desired. Obviously, if it is desirable to have a compliant position at some other angle, it can be readily achieved by including a slot at an appropriate location.

A tumble motion lock mechanism is also provided for use when it is desired to lock test head 20 in this degree of freedom. The mechanism comprises lock handle 235, threaded lock rod 230, plastic tip 231, and lock bracket 240. Lock bracket 240 is attached to the vertical mounting plate 116 of vertical support 110 with appropriate fasteners such as screws. Lock handle 235 is fixed to lock rod 230. Lock rod 230 includes a threaded section along its length and is threaded through a tapped hole in bracket 240. A plastic tip 231 is attached to the distal end of lock rod 230. These components are arranged so that the axis of rod 230 is in the plane of coupling bracket 120. Thus, rotation of handle 235 in a first direction (typically clockwise) will cause tip 231 to move in the direction of and ultimately engage the edge of curved portion 124 of coupling bracket 120. With tip 231 pressing firmly against the edge of coupling bracket 120, tumble motion of test head 20 is prevented; and this motion axis is accordingly locked. Rotation of handle 235 in the opposite (typically counterclockwise) direction will cause tip 231 to move away from the edge of coupling plate 120, unlocking the tumble axis and allowing tumble motion.

Referring to FIG. 26, the coupling bracket 140 of the vertical support 110' is similarly rotatably mounted to mounting plate 116 with an appropriate bearing unit inserted into a suitably located bore in plate 116. Coupling bracket 140 is not required to additionally provide the above functions, and therefore, is configured to provide simple pivotal support of one side of the test head 20. As such, coupling bracket 140 is a linear plate pivotally connected to the respective vertical mounting plate 116 via pivotal coupling 143. A pair of mounting bores 145 are provided along the coupling bracket 140 and are configured to facilitate interconnection between a second test head mounting bracket 24 on the opposite side thereof and the coupling bracket 140.

Comparing FIGS. 7 and 8, it is shown that the test head mounting brackets 22 and 24 are preferably oriented 90° relative to one another.

In order to adapt the manipulator to different peripherals it may be necessary to locate test head 20 at different locations with respect to mounting plate 116. For example, a peripheral requiring docking in the dut-vertical position may require the test head to be mounted in a higher location than a peripheral requiring docking in a dut-up orientation. Additional pivot coupling 123 mounting bores may be included in mounting plates 116 at the time of manufacture to facilitate changeover from one application to another in a reasonable time in the user's facility. For example, additional bores 223 are shown in plates 116 in FIGS. 21, 22, 24 and 26.

Figure 27:
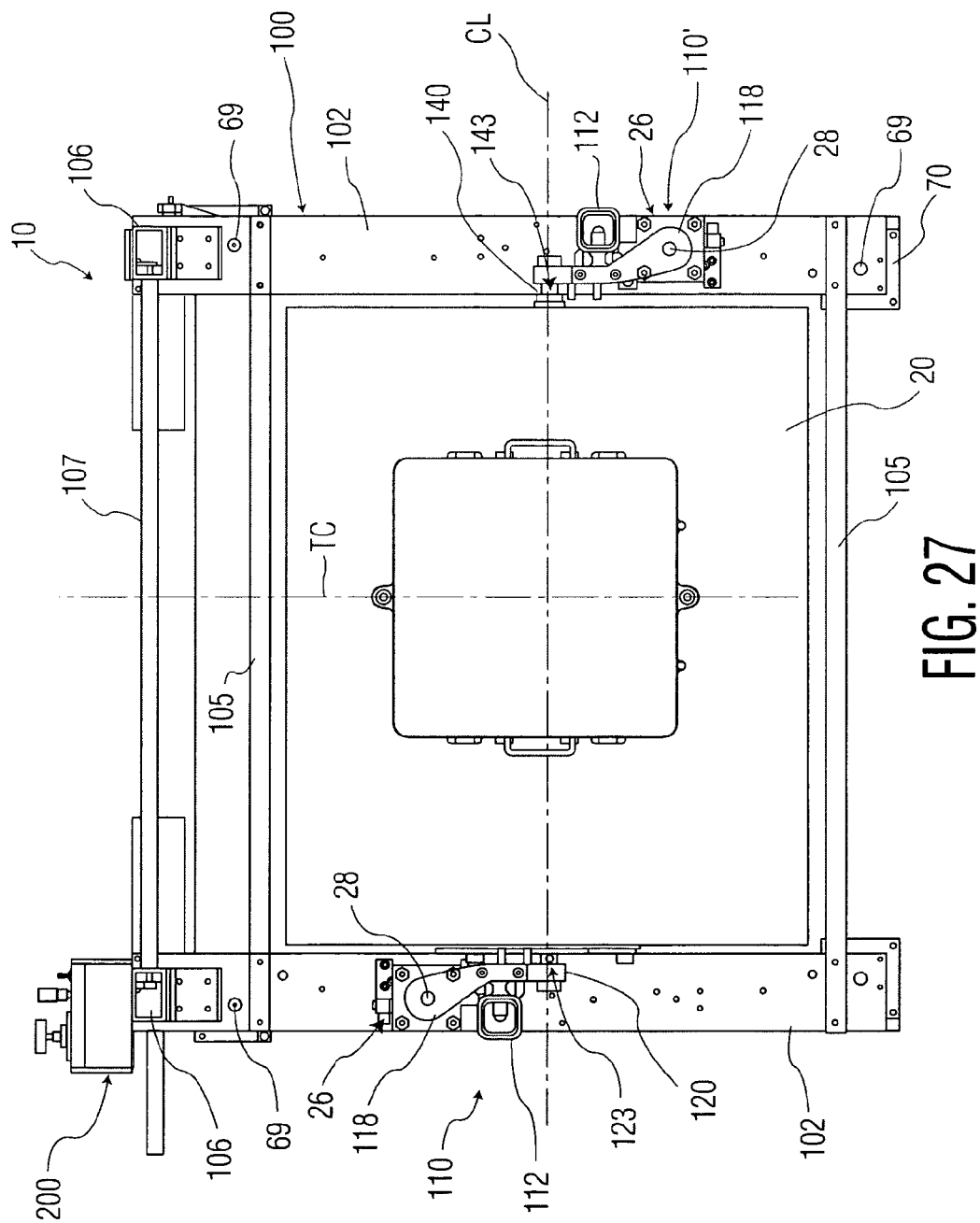
FIG. 27 is top plan view of the positioner system of FIG. 1.

Referring to FIG. 27, the vertical supports 110 and 110' are preferably mounted on opposite sides of the centerline CL of the support assembly 100, however, the pivot couplings 123 and 143 are along the centerline CL such that the load is balanced between the two vertical supports 110 and 110'. Additionally, it is preferable that the test head 20 is arranged so that its center-of-gravity (cg) is substantially midway between the two vertical uprights 106 such that the pressure in the two pneumatic units 26 will nominally be equal in supporting the test head 20 in a level orientation, and one regulator may be used to provide fluid to both cylinders. If the cg is badly off center (a rare occurrence), a system with two regulators may be used wherein each pneumatic unit 26 is independent of the other. If the cg is slightly off center, suitable weights may be added to test head 20 to provide balance.

Figure 28:
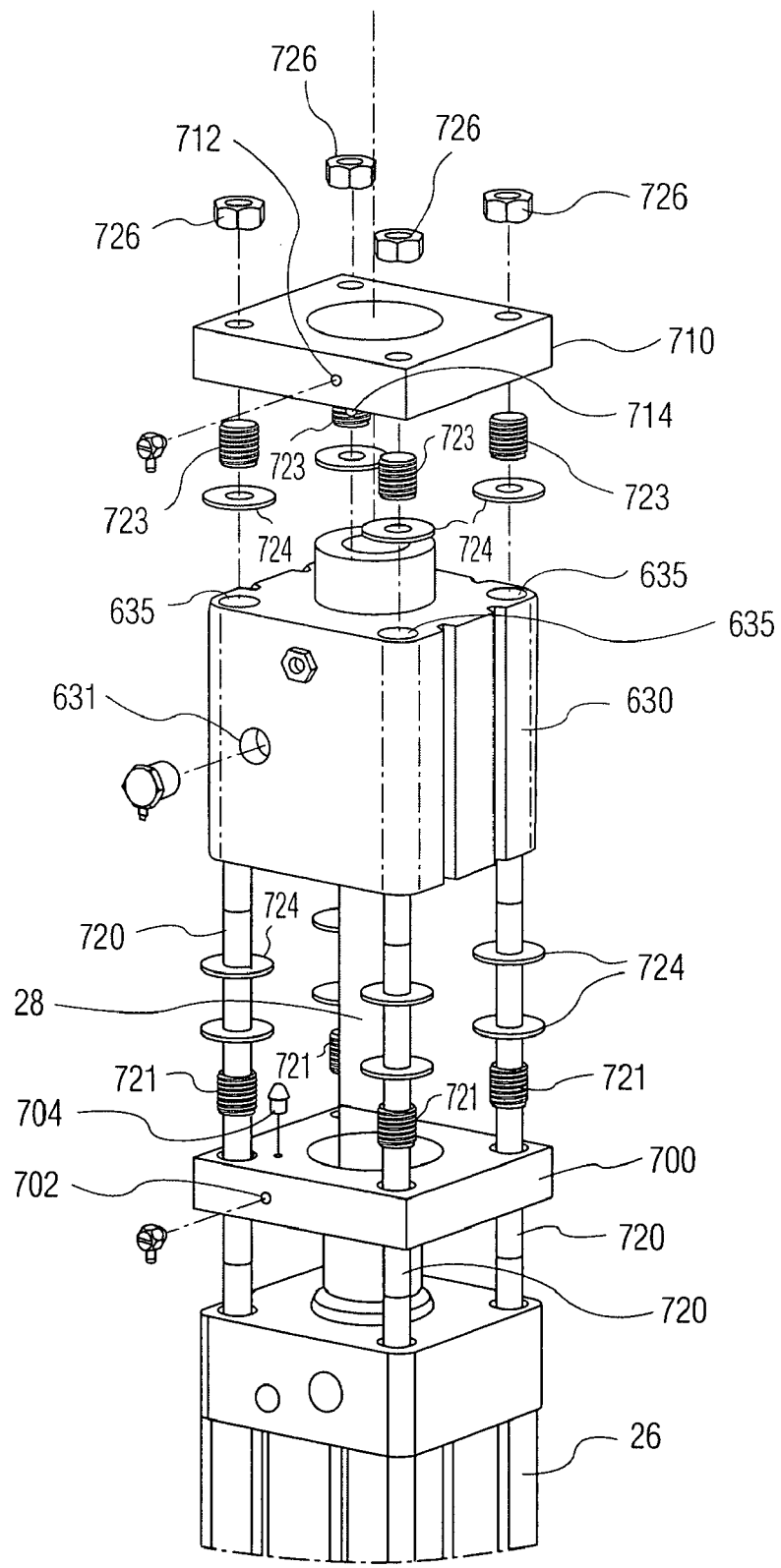
FIG. 28 is an exploded perspective view of a portion of an exemplary pneumatic unit.
Figure 29:
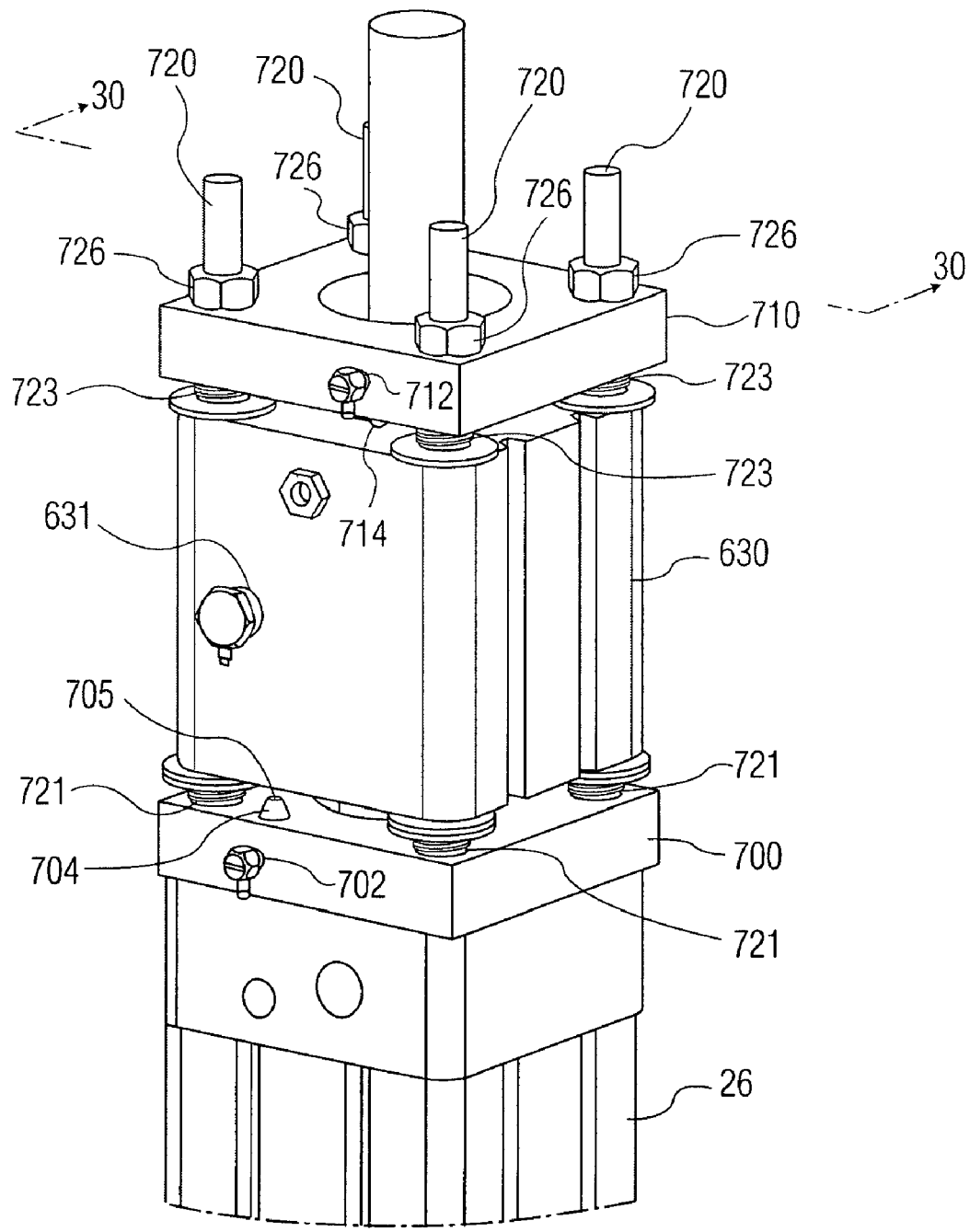
FIG. 29 is an assembled perspective view of the pneumatic unit of FIG. 28.
Figure 30:
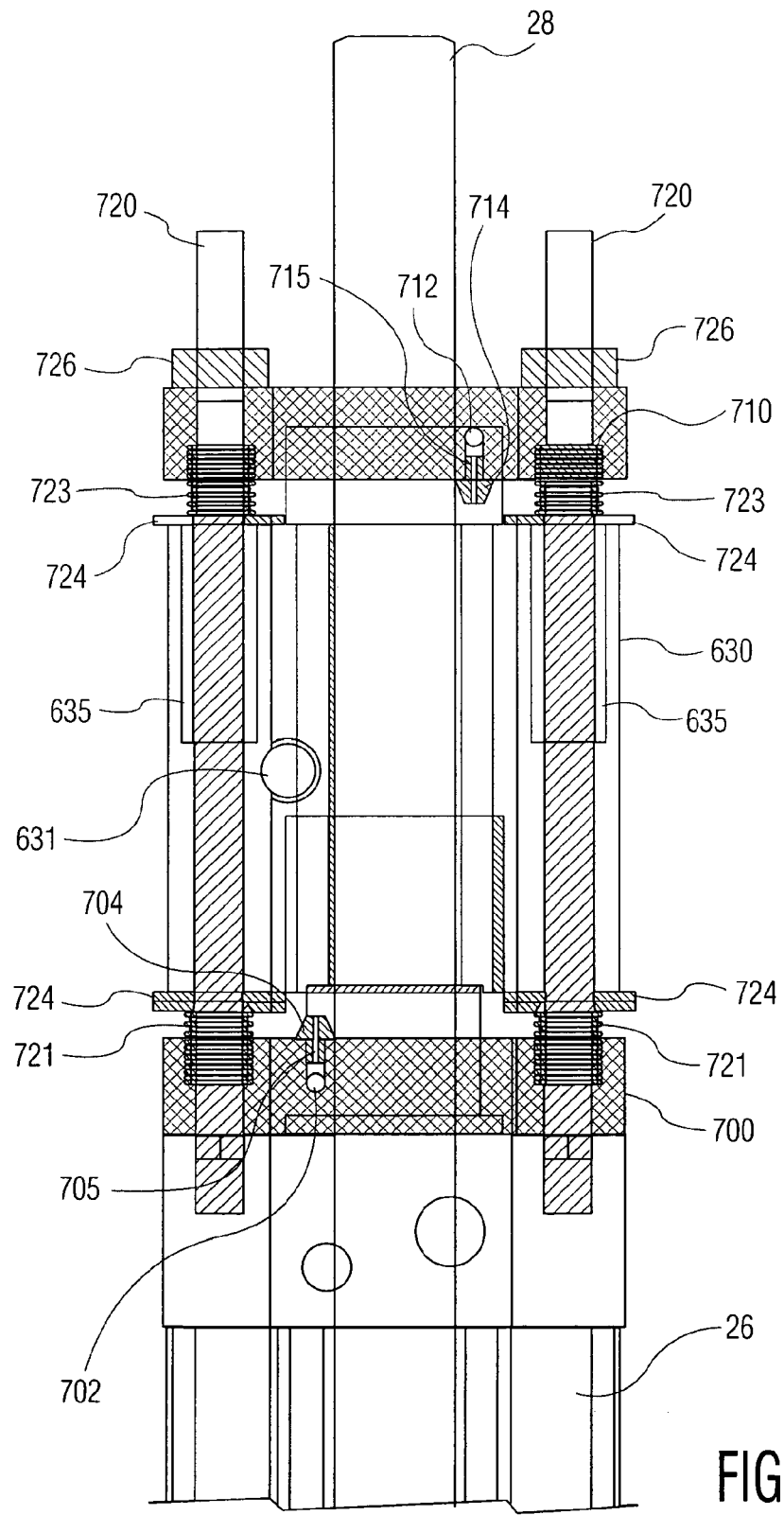
FIG. 30 is a cross-sectional view of the pneumatic unit taken along the lines 30-30 shown in FIG. 29.

Referring to FIGS. 28-30, an exemplary pneumatic unit 26 will be described. Preferably, both pneumatic units are the same configuration. The pneumatic unit 26 includes a telescoping piston rod 28. In the illustrated embodiment, the pneumatic unit 26 includes a brake lock 630 configured to lock the position of the telescoping piston rod 28 relative to the cylinder block of the pneumatic unit 26. The brake lock 630 is further configured to provide a pneumatic signal to the pneumatic control unit 200 if the pneumatic cylinder is out of balance by more than a given amount. The pneumatic control unit 200 may be configured to prevent unlocking of the brake lock 630 when such signal is received.

Referring to FIGS. 28-30, the brake lock 630 includes a brake control port 631. The brake lock 630 has a default locked position such that the lock is applied when no pressure is received through port 631. When the brake lock 630 is switched to an unlocked position, fluid will be provided to port 631 to release the brake lock 630 provided an unbalanced condition is not detected as described below.

In the present embodiment, the brake lock 630 includes through passages 635 which facilitate positioning of the brake lock 630 on corresponding support rods 720. The support rods 720 are each secured at a first end to the cylinder block of the pneumatic unit 26. The brake lock 630 is axially moveable along the rods 720 between a bottom contact plate 700 and a top contact plate 710. Springs 721 or the like are positioned between the bottom plate 700 and the brake lock 630 and springs 723 or the like are positioned between the top plate 710 and the brake lock 630. The springs 721 and 723 support the brake lock 630 for a limited range of motion between the plates 700 and 710. Nuts 726 or the like are secured to the opposite ends of the rods 720 to axially secure the plates 700, 710, springs 721, 723 and brake lock 630. The amount of tightening of the nuts 726 may be utilized to control the range of motion of the brake lock 630 between the plates 700 and 710, thereby control the tolerance or sensitivity of the unbalanced signal.

As described with reference to FIG. 31, when the lock switch is moved to the locked position, pneumatic pressure is removed from the brake lock 630 and the lock is applied to the piston rod 28, thereby fixing the lock relative to the piston rod 28. In the present embodiment, the springs 721, 723 allow the brake lock 630 to move over a limited range of motion. As such, for example, if the brake lock 630 is locked and thereafter additional weight or external force is applied on the piston rod 28, the piston rod 28, and the brake lock 630 fixed thereto, will move against the force of springs 721. If the weight or external force is sufficient, the brake lock 630 will move into contact with the bottom plate 700. As described hereinafter, the system is configured to provide a pneumatic signal indicating an unbalanced condition when the brake lock 630 moves into contact with the bottom plate 700. Similarly, if weight is removed from the piston rod 28, the piston rod 28, and the brake lock 630 fixed thereto, will move upward against the force of springs 723 due to the pressure in the pneumatic unit 26. If the decrease is sufficient, the brake lock 630 will move into contact with the top plate 710. Again, the system is configured to provide a pneumatic signal indicating an unbalanced condition when the brake lock 630 moves into contact with the top plate 710.

Figure 31:
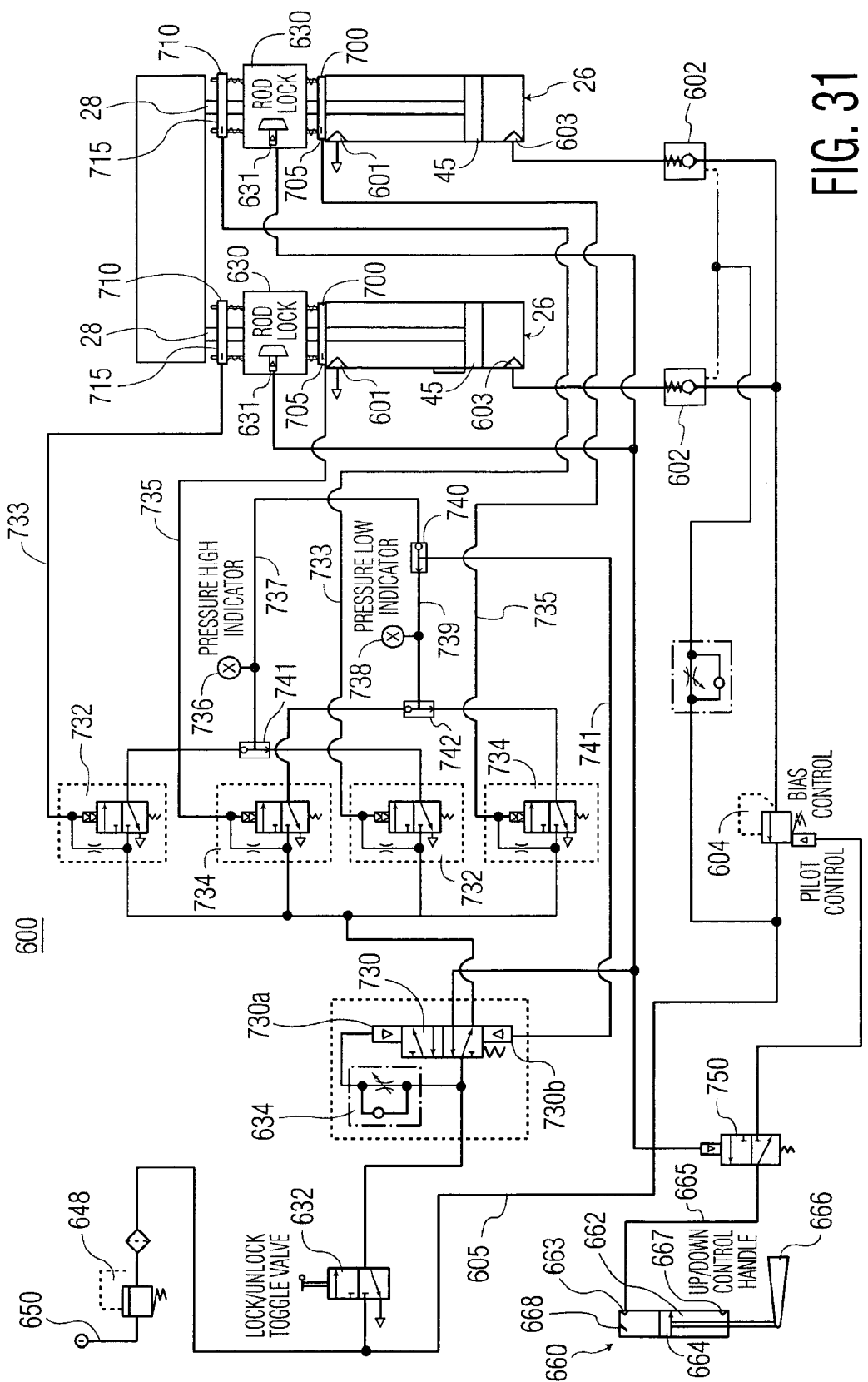
FIG. 31 is a schematic diagram of a portion of an exemplary pneumatic system for controlling movement of the positioner system.

Referring to FIG. 31, an exemplary pneumatic system 600 which is part of the pneumatic control unit 200 and which is configured to control the linear motion of both of the telescoping piston rods 28 will be described. The pneumatic system 600 is configured to control the pressure and flow of fluid to each pneumatic unit 26 to control the up and down motion of the piston rods 28 as well as its static and compliant behavior. In the illustrated embodiment, a single throttle control assembly 660 controls both pneumatic units 26.

Each pneumatic unit 26 is a double acting cylinder which is vented to atmosphere at port 601 on one side of the piston 45 and connected to a pneumatic feed line 603 on the opposite side of the piston 45. A spring biased check valve 602 is provided in feed line 603 and is configured to close upon loss of pilot pressure in the system to prevent falling of the piston rod 28. A piloted, biased pressure regulator 604 is positioned along the feed line 603 and is configured to control the pressure (and consequently the rate of flow) of the fluid delivered to the pneumatic unit 26. The pressure regulator 604 receives pressurized fluid from a pressure source 650 along pressure feed line 605. A pressure regulator 648 is provided along the pressure feed line 605 to regulate the fluid pressure to a desired pressure. Pressure regulator 648 also includes a filter (unnumbered) to clean the air as it enters the system.

A throttle assembly 660 is provided in the pneumatic system 600 to allow an operator to control upward and downward movement of the piston rod 28. The throttle assembly 660 includes a cylinder 662 with a piston 664 moveable within the cylinder 662 via a handle or the like. One end of the cylinder 662 includes a port 667 open to atmosphere and the other end includes a port 663 that is connected to a pilot line 665 fluidly connected to the pilot control of the biased pressure regulator 604. A variable volume chamber 668 is defined between the piston 664 and the port 663, however, the mass of fluid, e.g. air, within the chamber 668 and pilot line 665 is fixed.

The throttle assembly 660 is assembled such that when force is not applied to the handle 666, the piston 664 is positioned such that the fluid pressure within the chamber 668 and pilot line 665 is neutral, i.e. a zero pilot pressure (relative to atmospheric pressure) is provided to the pilot control of the biased pressure regulator 604. With no pilot pressure to the pilot control, biased pressure regulator 604 remains in the equalized position such that the piston rod 28 remains in the balanced or static state.

To move the telescoping column 20 upward, the operator moves the handle 666, and thereby the piston 664, toward the port 663, thereby reducing the volume of chamber 668. Since the fluid mass is constant, the decrease in volume of the chamber 668 will cause the fluid pressure in the chamber 668 and pilot line 665 to increase. The increased pressure is applied directly through the pilot line 665 to the pilot control of pressure regulator 604. As explained above, the set pressure of the biased pressure regulator 604 can be adjusted by adding or subtracting pilot pressure to the pilot control member.

In the up scenario, the positive pressure to the pilot control of biased pressure regulator 604 causes the set pressure of regulator 604 to increase, thereby increasing the pressure within pneumatic units 26, causing the piston rods 28 to rise. The amount of increase in the set pressure of regulator 604 correlates to the amount of additional positive pressure on the pilot control. Since movement of the handle 666 controls the volume of the chamber 668, the amount of increase in pilot pressure, and the corresponding increase in set pressure of regulator 604, is continuously variable over the range of movement of the piston 664 between the neutral position toward the port 663.

Upon release of the handle 666, the piston 664 moves back to the neutral position to allow the pressure within the chamber 668 and pilot line 665 to return to the neutral pressure.

To translate the piston rod 28 downward, the operator moves the handle 666 such that the piston 664 moves from the neutral position away from the port 663, thereby increasing the volume of the chamber 668. Since the fluid mass is constant, the increase in volume of the chamber 668 will cause the fluid pressure in the chamber 668 and pilot line 665 to decrease. The decreased pressure is applied directly through the pilot line 665 to the pilot control of pressure regulator 604 which causes the set pressure of regulator 604 to decrease, thereby decreasing the pressure within pneumatic unit 26. As such, the weight of the piston rod 28 and the testing head 20 will be greater than the pressure in the pneumatic unit 26 and the piston rod 28 will be lowered. Again, release of the handle 666 will return the piston 664 to the neutral position, thereby discontinuing negative pilot pressure to the pilot control of the pressure regulator 604.

As with the up scenario, since movement of the handle 666 controls the volume of the chamber 668, the amount of decrease in pilot pressure, and the corresponding decrease in set pressure of regulator 604, is continuously variable over the range of movement of the piston 664 between the neutral position away from the port 663. In both the up and down scenarios, the variable pressure range provides a tactile feedback at the handle 666. The operator senses that the more force the operator applies to the handle 666, the more the pressure will change (either increase or decrease) in response thereto. This change in pressure, felt in force by the operator upon the handle 666, represents the force applied to the piston 45 via the biased pressure regulator 604 and throttle assembly 660, thus providing tactile feedback. The operator can also control the acceleration, speed, and position of the test head 20 in this manner. The operator may observe the movement and/or the behavior of the test head 20 as he or she causes the set pressure of biased regulator 604 and thus the force on piston 45 to change via moving the handle 666 up or down. The operator may adjust the handle 666 as necessary to initiate motion of the test head 20 at a desired rate, maintain a desired speed, and stop motion at a desired rate and position.

The exemplary pneumatic system 600 is also configured to provide a pneumatic signal of an unbalanced condition in either of the pneumatic units 26. Pressurized fluid is also provided to lock/unlock toggle valve 632. The toggle valve 632 is normally closed so that no pressure is applied to either brake lock 630, locking the brake locks 630 to the piston rods 28. To release the brake locks 630, the toggle is switched to the open position. The fluid flowing through the opened toggle valve 632 flows to a detector valve 730. The detector valve 730 is spring biased to an initial position wherein fluid travels toward a pair of sensor valves 732 and 734, but not to the brake lock port 631. The fluid also travels through a restrictor 634 toward an opening pilot 730a on the detector valve 730. The restrictor 634 is configured to provide a sufficient delay before the opening pilot is energized to open the detector valve from its initial position. In the present embodiment, each pneumatic unit 26 is provided with a pair of sensor valves 732 and 734. The output of the respective sensor valves 732 is coupled via a shuttle valve 741 and the output of the respective sensor valves 734 is coupled via a shuttle valve 742. As such, the operation will be described with respect to a single set of sensor valves 732 and 734.

Sensor valve 732 is connected via line 733 to an inlet port 712 on top plate 710 which is fluidly connected to an open port 715 through compressible plug 714 extending from the bottom surface of top plate 710, as shown in FIGS. 28-30. Similarly, sensor valve 734 is connected via line 735 to an inlet port 702 on bottom plate 700 which is fluidly connected to an open port 705 through compressible plug 704 extending from the top surface of bottom plate 710. Each of the sensor valves 732, 734 has a normally closed position such that the fluid flowing thereto bypasses the valve 732, 734 and flows out the respective open port 715, 705. Provided there is no back pressure, both sensor valves 732, 734 will remain in such closed condition.

If an unbalanced condition exists as described above, the brake lock 630 will contact one of the plates 700, 710 and compress the respective plug 704, 714, thereby closing the open port 705, 715. Due to the closed port, 705, 715, a back pressure will be received at the respective sensor valve 734, 732. The back pressure energizes the respective sensor pilot and causes the sensor valve 734, 732 to open. Fluid travels through the sensor 732, 734 and actuates a respective pressure high or pressure low indicator 736, 738. The flow continues through either line 737 or 739 and through a shuttle valve 740 to the maintain closed pilot 730b of detector valve 730. The force of the maintain closed pilot 730b in combination with the original spring bias of the valve 730 will maintain the valve 730 in its initial position even upon fluid passing through the restrictor 634 and reaching the opening pilot 730a. The detector valve 730 will remain in this initial position, and will not allow fluid to flow to the brake release port 631, until the load is balanced, thereby uncompressing the plug 704 or 714 and removing the back pressure on the actuated sensor valve 732, 734.

The pressure high and pressure low indicators 736, 738 may be utilized in rebalancing the load. As explained above, if the load is unbalanced when the toggle valve 632 is moved to the unlock position, the brake lock 630 will not release and either the pressure high indicator 736 or the pressure low indicator 738 will be actuated. Upon actuation, the indicators 736, 738 provide a signal to an operator that the load is unbalanced, i.e. if the load has been reduced, the pressure high indicator 736 will provide a signal and if load has been increased, the pressure low indicator 738 will provide a signal. The signals may take various forms, for example, an audible signal, a visual signal, or a combination thereof. In an exemplary configuration, each indicator 736, 738 includes an extensible post (not shown) which is pneumatically extending upon actuation of the indicator 736 or 738.

The indicator signals alert the operator to the necessary pressure adjustment to rebalance the load. If the pressure high indicator 736 is actuated and providing a signal, the operator is alerted to decrease the set pressure of the biased pressure regulator 604, for example, by reducing the force on the mechanical biasing member. If the pressure low indicator 738 is actuated and providing a signal, the operator is alerted to increase the set pressure of the biased pressure regulator 604, for example, by increasing the force on the mechanical biasing member. In an exemplary configuration, the means for increasing or decreasing the force on the mechanical biasing member is through a rotatable dial. In this configuration, the indicators 736, 738 may be positioned relative to the rotatable dial such that the actuated indicator 736 or 738 will guide the operator of the proper direction to rotate the dial to rebalance the load. For example, if counterclockwise rotation of the dial decreases the set pressure and clockwise rotation of the dial increases the set pressure, the pressure high indicator 736 is positioned to the left of the dial and the pressure high indicator 738 is positioned to the right of the dial. As such, if the pressure high indicator 736 is actuated, the operator will know to turn toward the indicator 736, thereby turning the dial in the counterclockwise direction, and conversely, if the pressure low indicator 738 is actuated, the operator will know to turn toward the indicator 738, thereby turning the dial in the clockwise direction. The invention is not limited to this configuration of the adjustment mechanism or indicators.

Once the load is rebalanced, or if the load was balanced to begin, both ports 715 and 705 will remain open and the corresponding sensor valves 732, 734 will remain closed. With the sensor valves 732, 734 closed, no fluid pressure flows to the maintain closed pilot 730b of the detector valve 730. As such, the fluid which flows through the restrictor 634 will reach the opening pilot 730a and provide a force sufficient to overcome the original spring bias of the detector valve 730, thereby causing the detector valve 730 to open to allow fluid to flow to the release port 631 of the brake lock 630. In the present embodiment, fluid also flows to an opening pilot of a throttle release valve 750. The throttle release valve 750 is positioned along the pilot line 665 and has a default closed position such that the throttle can not be used for up or down movement until the detector valve 730 is opened and the brake lock 630 released.

Figure 32:
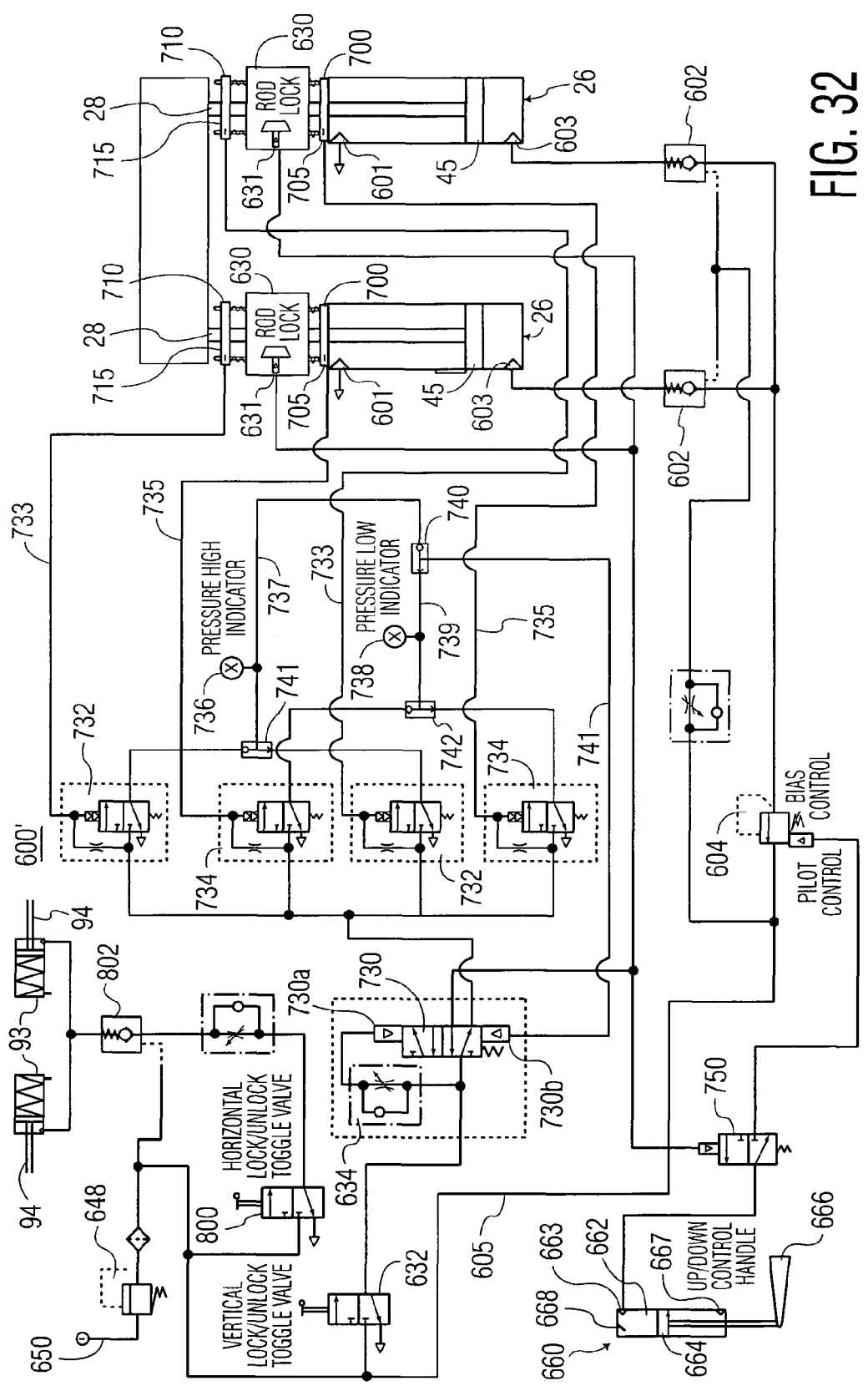
FIG. 32 is a schematic diagram of a portion of another exemplary pneumatic system for controlling movement of the positioner system.

Another exemplary pneumatic control system 600' is illustrated in FIG. 32. This system is substantially the same as in the previous embodiment, but further includes a second toggle valve 800 configured to control the pneumatic cylinders 93 of the centering units 80. As explained above, the pneumatic cylinders 93 are biased to an extended position of the piston rod 94, such that the posts 74 are free to move. Upon actuation of the toggle valve 800, fluid is supplied to the cylinders 93 to retract the rods 94, thereby locking the centering units 80. A check valve 802 is positioned along the line between the valve 800 and the cylinders 93 to trap air in these cylinders 93 in the case of system pressure loss or turning off the air to the system to allow the centering units 80 to still hold the base compliance modules in the locked position.

The illustrated embodiments show various features which may be incorporated into the pneumatic control unit 200. The invention is not limited to the illustrated features. Furthermore, while the system is described as a pneumatic system utilizing pressurized air, other fluids may be utilized.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. An apparatus for supporting a device, comprising:
   a base assembly;
   a load support plate above said base assembly;
   at least one carrier column extending vertically from said load support plate;
   a vertical support plate moveable along said at least one carrier column over a given range between lower most and upper most positions, and including a pivotal device mounting bracket for at least partially supporting said device; and
   a plurality of compliant motion units situated below said load support plate and above said base assembly, each compliant motion unit in said plurality of compliant motion units horizontally spaced apart from each of the other compliant motion units situated below said load support plate and above said base assembly plate and providing support to the weight of the device, each of said compliant motion units contacting below said load support plate and above said base assembly at respective points of contact, each of said respective points of contact providing non linear and linear motion in the three horizontal degrees of freedom.

2. The apparatus of claim 1 wherein said carrier column includes a rail and said vertical support plate includes a linear bearing configured to move along said rail.

3. The apparatus of claim 1 wherein said pivotal device mounting brackets is configured to provide tumble compliance.

4. The apparatus of claim 3 wherein said pivotal device mounting bracket includes at least a first compliance slot configured to receive a plunger rod associated with the vertical support plate, said compliance slot having a length greater than a width of said plunger rod.

5. The apparatus of claim 4 wherein said pivotal device mounting bracket includes a second compliance slot configured to receive the plunger rod and having a length greater than a width of said plunger rod, said second compliance slot positioned offset approximately 90° relative to said first compliance slot.

6. The apparatus of claim 3 further comprising a lock configured to lock the tumble orientation of said pivotal device mounting bracket relative to said support plate.

7. The apparatus of claim 1 wherein said pivotal device mounting bracket is pivotal between at least two different support orientations.

8. The apparatus of claim 1 wherein said device is a test head for testing integrating circuits.

9. The apparatus of claim 8 wherein said pivotal device mounting bracket is pivotal between at least two different support orientations including a DUT-up orientation and a DUT-vertical orientation.

10. The apparatus of claim 1 further comprising a fluidly operated brake lock configured to substantially lock the position of said piston rod upon engagement of the lock.

11. The apparatus of claim 1 further comprising a locking mechanism associated with a respective one of the compliant motion units and configured to lock said support assembly relative to said base assembly.

12. The apparatus of claim 11 wherein said locking mechanism is configured to center, within the range of motion, an engaged portion of said support assembly upon locking of said locking mechanism.

13. The apparatus of claim 11 wherein at least one of said compliant motion units does not have a locking mechanism associated therewith.

14. The apparatus of claim 1 wherein at least one of the compliant motion units comprises:
   a housing defining a range of motion aperture;
   a rotatable member within said housing; and
   a support member supported on said rotatable member and moveable relative thereto;
   said support member including a load support post which extends through the range of motion aperture and is configured to supportingly engage a portion of said support assembly.

15. The apparatus of claim 14 wherein said housing is fixed relative to said base.

16. The apparatus of claim 14 further comprising a locking mechanism associated with said at least one of the compliant motion units and configured to lock said load support post relative to said housing.

17. The apparatus of claim 16 wherein said locking mechanism includes a pair of opposed blades each pivotally supported on said housing, said blades moveable between an unlocked position wherein said blades do not overlie said range of motion aperture and a locked position wherein said blades overlie said range of motion aperture and define a reduced post retaining area between said blades.

18. The apparatus of claim 17 wherein said reduced post retaining area is centered relative to said range of motion aperture.

19. The apparatus of claim 17 wherein movement of said blades between said locked position and said unlocked position is fluidly controlled.

20. An apparatus according to claim 1, further comprising a mechanism for providing force to said vertical support plate in order to move said vertical support plate from a vertically lower elevation to a vertically higher elevation along said carrier column.

21. The apparatus of claim 20 wherein said mechanism extends in a first vertical plane and a further mechanism extends in a second vertical plane and said vertical support plates are configured to support said device with a center of gravity of said device positioned aligned with or between said first and second vertical planes.

22. An apparatus according to claim 20, wherein said mechanism includes a piston rod.

23. An apparatus according to claim 22, wherein said piston rod is raised with fluid pressure.

24. The apparatus of claim 23 wherein a fluidly operated brake lock is associated with said piston and the brake lock is further configured to sense when a supported load is unbalanced and prevent disengagement of the lock when the load is unbalanced.

25. An apparatus for supporting a device, comprising:
a base assembly;
a load support plate above said base assembly;
a support assembly configured to support said device, said support assembly above said load support plate; and
a plurality of compliant motion units situated below said load support plate and above said base assembly, each compliant motion unit in said plurality of compliant motion units horizontally spaced apart from each of the other compliant motion units situated below said load support plate and above said base assembly plate and providing support to the weight of the device, each of said compliant motion units contacting below said load support plate and above said base assembly at respective points of contact, each of said respective points of contact providing non linear and linear motion in the three horizontal degrees of freedom.

26. The apparatus of claim 25 further comprising a locking mechanism associated with a respective one of the compliant motion units and configured to lock said support assembly relative to said base assembly.

27. The apparatus of claim 26 wherein said locking mechanism is configured to center, within the range of motion, an engaged portion of said support assembly upon locking of said locking mechanism.

28. The apparatus of claim 26 wherein at least one of said compliant motion units does not have a locking mechanism associated therewith.

29. The apparatus of claim 25 wherein said compliant motion unit comprises:
a housing defining a range of motion aperture;
a rotatable member within said housing; and
a support member supported on said rotatable member and moveable relative thereto;
said support member including a load support post which extends through the range of motion aperture and is configured to supportingly engage a portion of said support assembly.

30. The apparatus of claim 29 wherein said housing is fixed relative to said base.

31. The apparatus of claim 29 further comprising a locking mechanism associated with said compliant motion unit and configured to lock said load support post relative to said housing.

32. The apparatus of claim 31 wherein said locking mechanism includes a pair of opposed blades each pivotally supported on said housing, said blades moveable between an unlocked position wherein said blades do not overlie said range of motion aperture and a locked position wherein said blades overlie said range of motion aperture and define a reduced post retaining area between said blades.

33. The apparatus of claim 32 wherein said reduced post retaining area is centered relative to said range of motion aperture.

34. The apparatus of claim 32 wherein movement of said blades between said locked position and said unlocked position is fluidly controlled.

35. The apparatus of claim 25 wherein said base assembly is supported on a plurality of casters.

36. The apparatus of claim 35 wherein at least one of the casters is a fixed direction caster and at least one of the casters is a swivel caster.

37. The apparatus of claim 36 wherein each swivel caster includes an associated lock.

* * * * *